(12) United States Patent
Ki et al.

(10) Patent No.: US 11,838,035 B2
(45) Date of Patent: *Dec. 5, 2023

(54) USING PREDICATES IN CONDITIONAL TRANSCODER FOR COLUMN STORE

(71) Applicant: Samsung Electronics Co., Ltd., Suwon-si (KR)

(72) Inventors: Yang Seok Ki, Palo Alto, CA (US); Ho Bin Lee, San Jose, CA (US)

(73) Assignee: SAMSUNG ELECTRONICS CO., LTD.

(*) Notice: Subject to any disclaimer, the term of this patent is extended or adjusted under 35 U.S.C. 154(b) by 0 days.

This patent is subject to a terminal disclaimer.

(21) Appl. No.: 17/518,581

(22) Filed: Nov. 3, 2021

(65) Prior Publication Data

US 2022/0060195 A1    Feb. 24, 2022

Related U.S. Application Data

(63) Continuation of application No. 16/820,675, filed on Mar. 16, 2020, now Pat. No. 11,184,021.

(Continued)

(51) Int. Cl.
*H03M 7/30* (2006.01)
*G06F 3/06* (2006.01)
*H03M 7/46* (2006.01)

(52) U.S. Cl.
CPC ........ *H03M 7/3066* (2013.01); *G06F 3/0604* (2013.01); *G06F 3/0656* (2013.01);

(Continued)

(58) Field of Classification Search
CPC .... H03M 7/3066; H03M 7/3059; H03M 7/46; H03M 7/6011; H03M 7/3088;

(Continued)

(56) References Cited

U.S. PATENT DOCUMENTS 5,861,827 A    1/1999    Welch et al.
5,918,225 A    6/1999    White et al.

(Continued)

FOREIGN PATENT DOCUMENTS

CA    2156889 C    11/1999
CN    106354699 A    1/2017

(Continued)

OTHER PUBLICATIONS

Corrected Notice of Allowability for U.S. Appl. No. 16/820,665, dated Sep. 2, 2021.

(Continued)

*Primary Examiner* — Francisco A Grullon
(74) *Attorney, Agent, or Firm* — Renaissance IP Law Group LLP

(57) ABSTRACT

A storage device is disclosed. The storage device may comprise storage for input encoded data. A controller may process read requests and write requests from a host computer on the data in the storage. An in-storage compute controller may receive a predicate from the host computer to be applied to the input encoded data. A transcoder may include an index mapper to map an input dictionary to an output dictionary, with one entry in the input dictionary mapped to an entry in the output dictionary, and another entry in the input dictionary mapped to a "don't care" entry in the output dictionary.

20 Claims, 19 Drawing Sheets

Related U.S. Application Data

(60) Provisional application No. 62/945,877, filed on Dec. 9, 2019, provisional application No. 62/945,883, filed on Dec. 9, 2019, provisional application No. 62/834,900, filed on Apr. 16, 2019, provisional application No. 62/819,499, filed on Mar. 15, 2019.

(52) U.S. Cl.
CPC ........ *G06F 3/0679* (2013.01); *H03M 7/3059* (2013.01); *H03M 7/46* (2013.01); *H03M 7/6011* (2013.01)

(58) Field of Classification Search
CPC ...... H03M 7/30; G06F 3/0604; G06F 3/0656; G06F 3/0679; G06F 3/0608; G06F 3/064
See application file for complete search history.

(56) References Cited

U.S. PATENT DOCUMENTS

| | | | |
|---|---|---|---|
| 7,646,317 | B2 | 1/2010 | Chen |
| 7,966,343 | B2 | 6/2011 | Yang et al. |
| 7,978,768 | B2 | 7/2011 | Koto |
| 8,032,499 | B2 | 10/2011 | Faerber et al. |
| 8,159,374 | B2 | 4/2012 | Schneider |
| 8,170,095 | B2 | 5/2012 | Roman |
| 8,626,725 | B2 | 1/2014 | Netz et al. |
| 8,762,387 | B1 | 6/2014 | Patel et al. |
| 8,930,798 | B2 | 1/2015 | Cideciyan et al. |
| 9,418,091 | B2 | 8/2016 | Li et al. |
| 9,779,071 | B2 | 10/2017 | Kataoka et al. |
| 10,951,679 | B2 | 3/2021 | Corley et al. |
| 10,951,905 | B2 | 3/2021 | Mao et al. |
| 10,951,906 | B2 | 3/2021 | Kelly et al. |
| 11,139,827 | B2 * | 10/2021 | Ki ........................ H03M 7/3059 |
| 11,184,021 | B2 * | 11/2021 | Ki .......................... G06F 3/0604 |
| 2003/0138158 | A1 | 7/2003 | Schwartz |
| 2008/0294676 | A1 * | 11/2008 | Faerber ............... G06F 16/2455 707/999.102 |
| 2009/0002207 | A1 | 1/2009 | Harada et al. |
| 2009/0060047 | A1 | 3/2009 | Schneider |
| 2009/0254532 | A1 * | 10/2009 | Yang .................... G06F 16/221 |
| 2010/0214137 | A1 | 8/2010 | Schneider |
| 2012/0194361 | A1 * | 8/2012 | Archbold ................. H03M 7/30 341/87 |
| 2013/0060780 | A1 * | 3/2013 | Lahiri ..................... H03M 7/42 707/E17.037 |
| 2016/0094242 | A1 | 3/2016 | Ackerman et al. |
| 2017/0011022 | A1 * | 1/2017 | Grossman ............. G06F 40/117 |
| 2017/0155403 | A1 | 6/2017 | Kletter |
| 2019/0171634 | A1 * | 6/2019 | Nowakiewicz ....... G06F 16/244 |
| 2019/0279095 | A1 * | 9/2019 | Guntoro ................... G06N 3/04 |
| 2020/0295779 | A1 | 9/2020 | Ki et al. |
| 2022/0309180 | A1 * | 9/2022 | Barbas ................ G06F 21/6227 |

FOREIGN PATENT DOCUMENTS

| | | |
|---|---|---|
| CN | 108197087 A | 6/2018 |
| JP | 2007096800 A | 4/2007 |
| JP | 2017028372 A | 2/2017 |
| KR | 20170042431 A | 4/2017 |
| TW | 410311 B | 11/2000 |
| TW | 200844798 A | 11/2008 |
| WO | 9952111 A1 | 10/1999 |

OTHER PUBLICATIONS

Corrected Notice of Allowability for U.S. Appl. No. 16/820,675, dated Aug. 3, 2021.

Notice of Allowance for U.S. Appl. No. 16/820,665, dated Apr. 15, 2021.

Notice of Allowance for U.S. Appl. No. 16/820,675, dated Jul. 22, 2021.

* cited by examiner

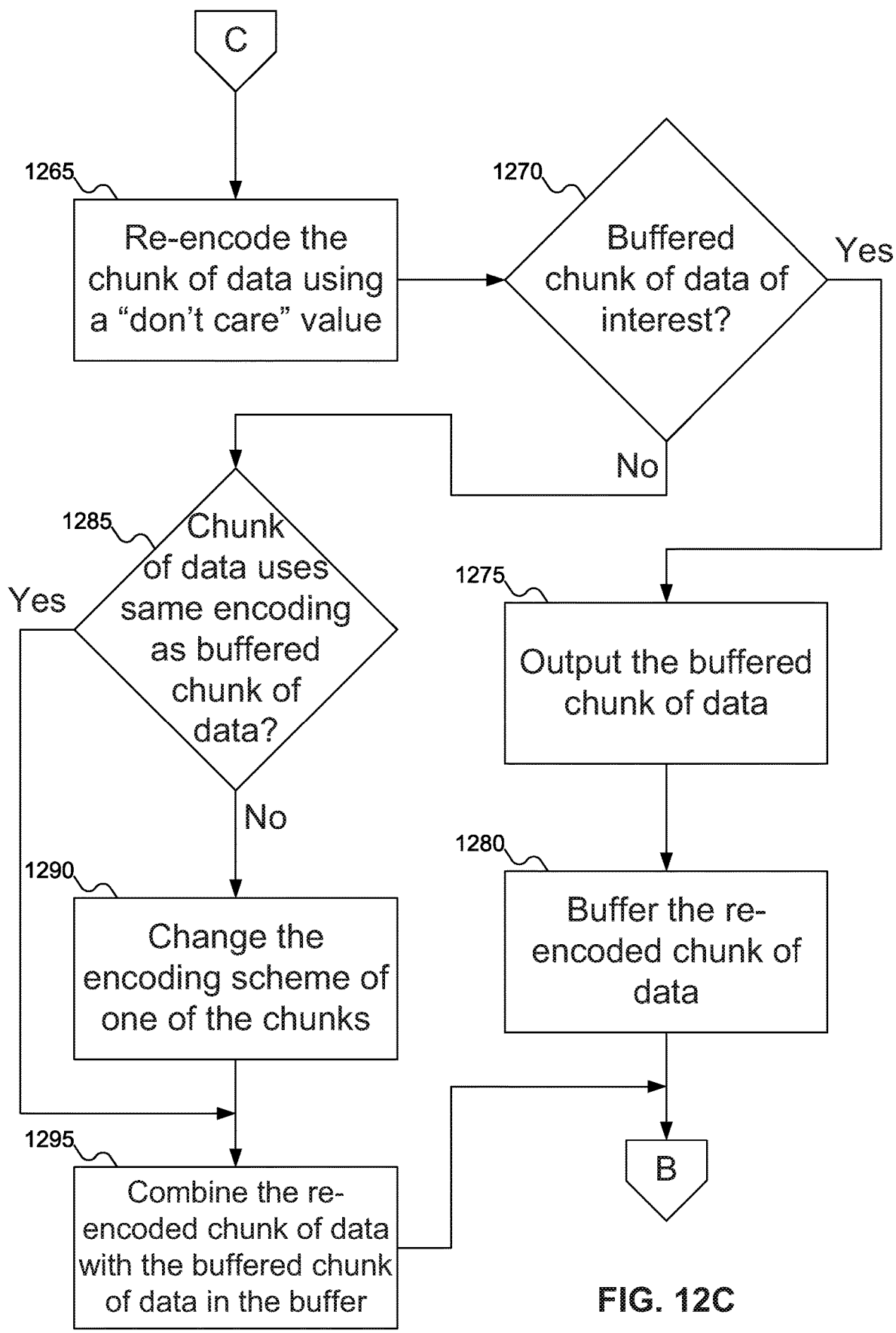

USING PREDICATES IN CONDITIONAL TRANSCODER FOR COLUMN STORE

RELATED APPLICATION DATA

This application is a continuation of U.S. patent application Ser. No. 16/820,675, filed Mar. 16, 2020, now allowed, which claims the benefit of U.S. Provisional Patent Application Ser. No. 62/819,499, filed Mar. 15, 2019, U.S. Provisional Patent Application Ser. No. 62/834,900, filed Apr. 16, 2019, U.S. Provisional Patent Application Ser. No. 62/945,877, filed Dec. 9, 2019, and U.S. Provisional Patent Application Ser. No. 62/945,883, filed Dec. 9, 2019, all of which are incorporated by reference herein for all purposes.

This application is related to U.S. patent application Ser. No. 16/820,665, filed Mar. 16, 2020, now U.S. Pat. No. 11,139,827, issued Oct. 5, 2021, which claims the benefit of U.S. Provisional Patent Application Ser. No. 62/819,499, filed Mar. 15, 2019, U.S. Provisional Patent Application Ser. No. 62/834,900, filed Apr. 16, 2019, U.S. Provisional Patent Application Ser. No. 62/945,877, filed Dec. 9, 2019, and U.S. Provisional Patent Application Ser. No. 62/945,883, filed Dec. 9, 2019, all of which are incorporated by reference herein for all purposes.

FIELD

The inventive concepts relate generally to storage devices, and more particularly to transcoding data within the storage device.

BACKGROUND

Storage devices, such as Solid State Drives (SSDs), may store relatively large amounts of data. A host processor may request data from the SSD to perform an operation on the data. Transmitting this data to the host processor may require relatively substantial amounts of time, depending on the specific architecture connecting host processor and SSD. For example, if the host processor and the SSD are connected using 4 lanes of generation 3 Peripheral Component Interconnect Express (PCIe), the maximum amount of data that may be carried between SSD and host processor is about 4 GB per second.

A need remains to reduce the amount of data being sent to the host, and to leverage the benefits of a columnar format.

BRIEF DESCRIPTION OF THE DRAWINGS

FIGS. 12A-12C show a flowchart of an example procedure for the transcoder of FIGS. 4 and 6 to transcode data, according to an embodiment of the inventive concept.

DETAILED DESCRIPTION

Figure 1:
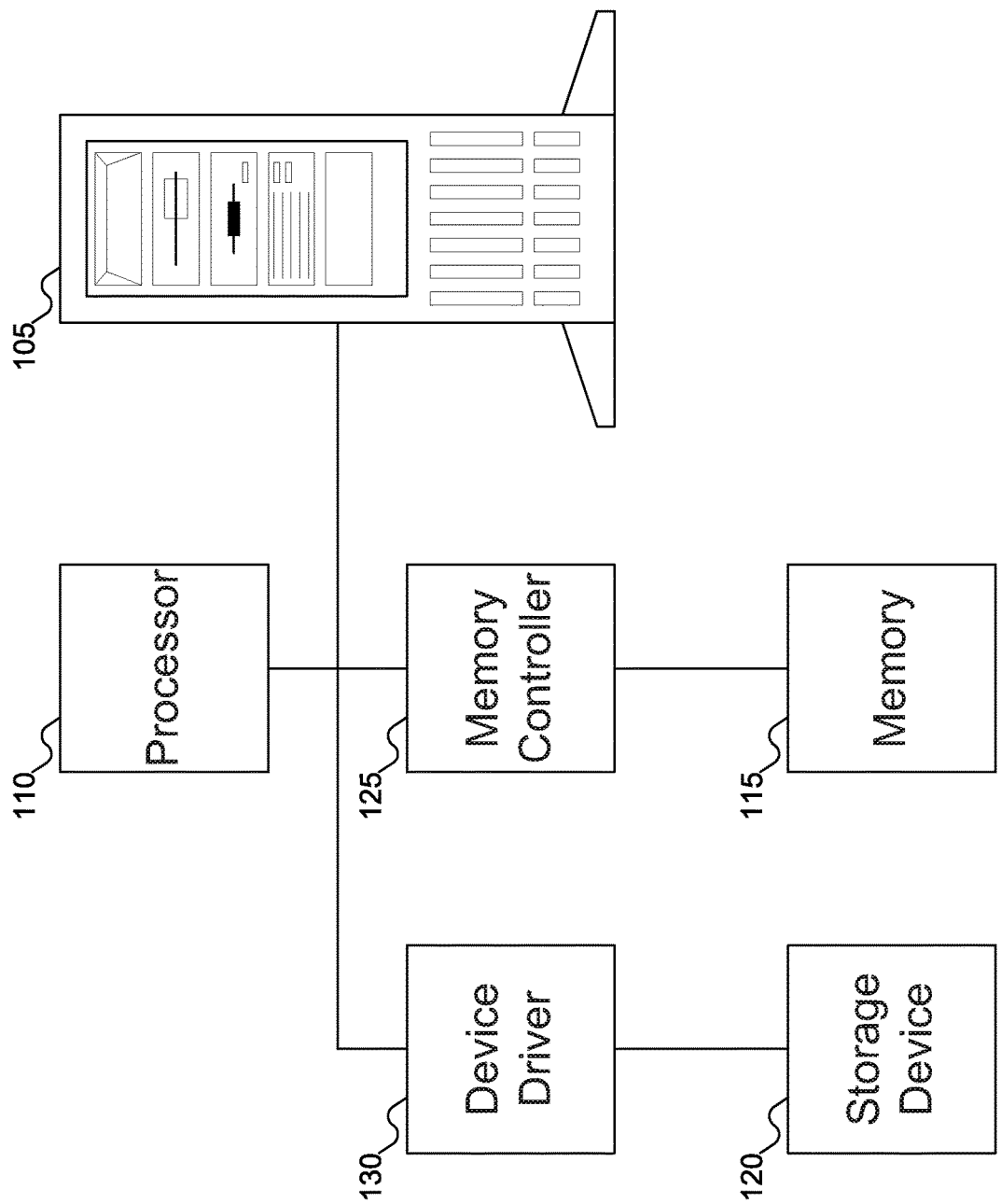
FIG. 1 shows a system including a storage device such as a Solid State Drive (SSD) that may support transcoding of encoded data, according to an embodiment of the inventive concept.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first module could be termed a second module, and, similarly, a second module could be termed a first module, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an", and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Placing some processing capability nearer to the SSD (e.g., using a Field Programmable Gate Array (FPGA), Application-Specific Integrated Circuit (ASIC), Graphics Processing Unit (GPU), or some other processor) introduces some advantages. First, the connection between the SSD and the near processor may support higher bandwidths than that connecting the SSD with the host processor, permitting faster data transfer. Second, by freeing the host processor from having to process the data, the host processor may carry out other functions while the near processor handles the data processing.

But near-storage processing of data has a potential disadvantage when data is compressed or encoded. Some near-storage processors, to operate on the raw data, may decompress or decode the data before they may operate on the data. Further, near-storage processors may report a result back to the host processor. If the amount of data that is sent to the host processor in the result is greater than the amount of raw data, the gains introduced by using a near-storage processor may be lost or, in the worst case, result in more data being sent to the host processor than if the compressed or encoded data had been sent to the host processor in the first place.

In addition, while transcoding may be done generally on data, when data is stored in a columnar format some adaptations may be made to take advantage of the columnar format.

Near-data processing of data in a compressed format may serve to negate some of the benefits of offloading. If the connection between the SSD and the host processor supports transmitting X bytes/second, the data is compressed using a compression ratio of Y, and the amount of data selected for transmission is Z, then the amount of data that the near processor sends to the host processor may be $X*Y*Z$. Acceleration (near processing) may be beneficial if this product is less than X: that is, if $Y*Z<1$.

In some embodiments of the inventive concept, columnar stores may use data encoding (e.g., Run Length Encoding (RLE)) and/or compression (snappy) to the reduce storage footprint. Encoding, not compression, may provide the major entropy reduction. The compression ratio after encoding tends to be small (about less than 2).

In some embodiments of the inventive concept, encoded data mat be near-processed without inflating the results (that is, resulting in a larger result being sent to the host processor than if the encoded raw data was sent to the processor), for example, based at least in part on the encoding algorithms. Encoding algorithms that may be used without inflating the results may include, but are not limited to, dictionary compression, Prefix Encoding, Run Length Encoding (RLE), Cluster Encoding, Sparse Encoding, and Indirect Encoding: other encoding algorithms may also be used in conjunction with embodiments of the inventive concept. While the embodiments of the inventive concept described below may focus on RLE and Bit Packing, embodiments of the inventive concept may extend to cover other encoding algorithms.

There is also the additional question of how to teach the transcoder what data to filter. This is particularly an issue where a dictionary that reduces the size of the data being stored may be stored somewhere other than where the data is being stored. A columnar store, an example of such a storage format, simplifies locating data of interest. But because the dictionary may be stored somewhere separate from the data, the system may need to be able to locate the dictionary as well as the data in question to perform transcoding.

Embodiments of the inventive concept enable filtering the encoded data without inflating the data. The filtered data may be re-encoded using the encoding information embedded in the encoded data using conversion rules. The transcoder in embodiments of the inventive concept may filter encoded data and modify the encoding that is sent to the host. Thus, instead of the host having to process plain data (which may be very large relative to encoded/compressed data, depending on the effectiveness of the compression algorithm and/or the encoded data), the host may receive and process encoded data. Because bandwidth between the host and the storage device may have limits that would materially affect the time it takes to transmit data, sending encoded data may save processing time as compared with sending plain data (filtered or not).

A Circular Buffer may store enough data to process at a time. Embodiments of the inventive concept may replace the Circular Buffer with buffers using other structures.

An Index Mapper may provide a mapping from the input Dictionary Map to a reduced Dictionary Map to be used with the Output stream.

A Current Encode Buffer may store data read from the Input Stream according to the appropriate encoding. A Rule Evaluator, using information from the transcoding rules, the Current Encode Buffer, and a Previous Encode Buffer, may decide how to process the data in the Current Encode Buffer. Depending on whether or not the data in the Current Encode Buffer may be combined with data in the Previous Encode Buffer, the Rule Evaluator may update the Previous Encode Buffer based on the data in the Current Encode Buffer, output the Previous Encode Buffer (and replace the Previous Encode Buffer with the Current Encode Buffer), or take some other action. For example, if the transcoder has identified values that are considered "don't care" values (discussed further below) in the Current Encode Buffer, those values might be combined with existing "don't care" values in the Previous Encode Buffer.

A Stream Splitter may be used to identify different portions (streams) of the input stream that are encoded using different encodings. If a single encoding scheme is used, the encoding scheme may be passed as a parameter (i.e., Encoding Type). Otherwise, if multiple encoding schemes are used (i.e., Encoding Type is not used), an encoding scheme for a given stream is determined by examining the input stream itself. For example, the 1st byte of data stored in a columnar storage format encoding may contain the encoding type information. For a hybrid of RLE and Bit Packing, if the LSB is 0, the Encoding Type=RLE; if the LSB is 1, then the Encoding Type=Bit Packing.

As examples of how various encodings work, consider RLE and Bit Packing (BP). In RLE, a variable unsigned integer is used to represent how often a value is repeated, then fixed length value is given. Thus, for example, instead of sending 00000011 00000011 00000011 00000011 00000011 00000011 00000011 00000011 00000011 (9 copies of the decimal value 3), the data may be encoded as 00001001 (decimal value 9) 00000011 (decimal value 3), indicating that 00000011 should be repeated 9 times.

In BP, data that is determined to occupy less space may be combined with other values. For example, if data is normally stored using 8 bits, then to store 4 values occupies 32 total bits. But if the values are known to occupy no more than 4 bits each, then two values may be stored in a single byte: this is bit packing in short. Because there is some overhead to indicate what data is packed versus what data is not packed, the savings in space is a little less than described, but still beneficial.

The encoding includes the number of groups in an unsigned byte, followed by a list of the packed values in one or more bytes. The maximum number of values in a group may be 8, and the maximum number of groups may be 63. Thus, for example, to represent the data 00000000 00000001 00000000 00000001 00000000 00000001 00000000 00000001 (decimal values 0 1 0 1 0 1 0 1), a group may be defined as 00000001 (group 1) 00010000 (0, 1) 00010000 (0, 1) 00010000 (0, 1) 00010000 (0, 1).

As mentioned above, RLE (and other encodings) may use variable unsigned integers. Variable unsigned integers may also use an encoding. In every eight bit group, the most significant bit may indicate whether the current byte is the last byte in the value or there is at least one subsequent byte. Where multiple bytes are used, the least significant byte is presented first, and the most significant byte last. Thus, for example, the decimal value 1 may be represented as 00000001, the decimal value 2 may be represented as 00000010, and so on until 01111111 (decimal value 127). Decimal value 128 may be represented as 10000000 00000001, decimal value 129 may be represented as 10000000 00000010, and so. Essentially, the binary value is divided into groups of 7 bits, with a 1 preceding each group of 7 bits except for the most significant group. For example, decimal value 16,384 may be represented as 10000000 10000000 00000001.

When processing encoded data using the transcoder, some data may be considered "don't care" data. That is, there may be some data that is not of value to the operation being performed. The data that is considered to be "don't care" data may be mapped to a different value as a result of the operation of the transcoder.

Consider the situation where a database stores citizenship information for various people. The citizenship could be stored using strings (such as "China", "Korea", "India", "United States", etc.) But since the possible values for citizenship are drawn from a finite set, a dictionary may be used to reduce the amount of data stored in the database. Thus, for example, the value "0" might represent China, the value "1" might represent India, the value "2" might represent Korea, and the value "3" might represent United States, with the representative values (indices) stored in the database rather than the country names. Since there are 195 countries (as of Jul. 19, 2019), one byte may be used to store the indices, far less than would be used to store a string of the country name using one byte per character.

But the acceleration operation being performed might be interested in citizens of the United States: for example, the operation might be to count the number of citizens of the United States are in the database. The citizens of other countries are therefore not relevant to the operation: they are "don't care" values. The transcoder may map the dictionary and the indices to reflect the data to which the operation applies.

A columnar format may use RLE or Bit Packing to encode information. Given a portion of a value string stored in a columnar storage format, one bit may be used to indicate whether the data is stored using RLE or Bit Packing; the rest of the data may then be understood accordingly.

To understand how a transcoder according to embodiments of the inventive concept may provide a replacement dictionary for encoded data, consider a situation in which the data includes citizenship information for a great number of people. Because the name of the country to which each person is a citizen is very long but the number of country names is relatively small (even representing 200 countries would occupy about 8 bits, still a significant savings from storing country name strings for each citizen at one byte per character in the country name), a dictionary provides a meaningful reduction in the amount of data being stored. This encoding may use any desired encoding scheme: for example, RLE encoding, dictionary compression, Prefix Encoding, Bit Packing, Cluster Encoding, Sparse Encoding, and Indirect Encoding.

Now, if the predicate (the filtering of the data) being applied is to locate just the citizens of the United States; data relating to other citizens is not of interest. For example, the host may be interested in knowing how many citizens of the United States are in the database. As a result of conversion the dictionary may be reduced to one entry for the United States citizens (there may also be an implicit or explicit entry for "don't care" entries), and the RLE encoding may be "compressed" to combine adjacent RLE entries for citizens of various countries that are not the United States. The encoding of the data is thus compressed to a dictionary including 1 (or 2) rows. The actual encoded data may also be reduced, since data relating to non-United States citizens may index to a single entry in the new dictionary. Thus, by pushing the predicate down into the transcoder, the encoded data may be filtered and a new encoding provided that reduces the amount of data ultimately sent to the host. A dictionary map may represent the mapping of the original dictionary to the transcoding dictionary.

A Field Programmable Gate Array (FPGA) may be used to implement (among other features) the transcoder, but embodiments of the inventive concept may include other forms of implementation, including, for example, an Application-Specific Integrated Circuit (ASIC), a Graphics Processing Unit (GPU), or some other processor executing software. In addition, an in-storage compute (ISC) controller may be separate from the FPGA, or it may be implemented as part of the FPGA as well.

Given a particular file on which acceleration functions (such as filtering) are to be performed, the ISC controller may use a File2Block Map to identify the blocks on the file storing the data for the file, along with their order. The ISC controller may be implemented as a component within the host (separate from the storage device itself) or may be a controller that is part of the storage device. These blocks may be accessed in order to provide an input stream that may be input (via the input buffer) into the transcoder.

When files are stored in columnar format, the unit of data may be the column chunk, which itself may include a number of pages of data. That is, an input buffer may receive a column chunk from the storage modules in the storage device, so that the transcoder may operate on that column chunk. In general, each column chunk may include its own metadata that may specify the encoding scheme used for that column chunk and/or the dictionary to be applied to data in that column chunk. However, not all storage formats use this arrangement: for example, a columnar storage format may store metadata in a separate area of the file (as opposed to within each column chunk): this metadata may specify the encoding and the dictionary used with the entire file. Thus, when a file is stored using such a columnar storage format, the ISC controller may retrieve the encoding and dictionary from the metadata area of the file (located using the File2Block Map) and provide that information to the transcoder, rather than assuming that the transcoder will receive whatever information is desired from the column chunk. (Of course, when using a columnar storage format, there may be no dictionary page in the column chunks.) Note that while the same encoding scheme may apply to every column chunk, that encoding scheme may itself be a hybrid scheme, utilizing two or more distinct encoding schemes and switching between them as appropriate. For example, a hybrid encoding scheme may combine RLE encoding and Bit Packing.

Aside from determining the dictionary and encoding scheme, the ISC controller may also extract the predicate to be applied to the encoded data, and may push that predicate down to the transcoder. The transcoder may then use all of this information in various ways. For example, information about the encoding being used with the file may be used to select the transcoding rules to be used with the data, whereas the dictionary and the predicate may be used to produce a transcoding dictionary and a dictionary map.

A Predicate Evaluator may use the predicate to determine what entries in the dictionary are of interest and which are not, generates the transcoding dictionary that stores the values of interest (and possibly a value representing "don't care" entries), and a dictionary map that maps indices from the original dictionary to the transcoding dictionary.

If the transcoding dictionary includes an entry for "don't care" values, this operation technically adds an entry to the dictionary (as the original dictionary includes no such value). Adding such an entry may introduce a new problem. Adding a "don't care" entry to the transcoding dictionary usually occurs at the first entry in the transcoding dictionary (index 0), intended to represent values that are unmatched to the predicate. But creating a new value for "don't care" entries may be expensive: the disclosed system may scan and remap the entire dictionary (since all the existing indices are off by 1). Adding a "don't care" entry may also result in memory reallocation or cause a bit width overflow: for example, if every possible value for a given number of bits is already in use as a dictionary index, then adding a "don't care" entry to the dictionary may increase the number of bits used to represent the index by 1. If a data page uses a portion of the dictionary, then the data page may have a smaller bit width, and adding the "don't care" entry to the transcoding dictionary means that one valid value may not be used in the data page. For example, if the bit width is 1, then adding a "don't care" entry may involve more values than may be represented using a single bit, whereas if the bit width is two, there may be room for a "don't care" entry without overflowing the bit width.

A solution to this problem is to determine whether Predicate pushdown is going to result in any reduction in the size of the dictionary. If the dictionary will be reduced by at least one entry, then there is room for a "don't care" entry without worrying about bit width overflow. If the dictionary would not be reduced by at least one entry, then the encoded data may be sent directly to the ISC controller/host without performing a transcoding, thereby avoiding the possibility that transcoding might increase the amount of data.

Note that the output of the transcoder may be sent (via an output buffer) back to the ISC controller. This serves two purposes. First, while pushing the predicate down into the transcoder may produce a transcoded data, there may still be operations to perform on the transcoded data. For example, if the host is attempting to count the number of United States citizens in the file, then the transcoded data will identify those citizens, but not count them: that operation may be performed by the ISC controller as an acceleration function. Second, the transcoded data may be sent back to the host for further operations. The ISC controller communicates with the host, and therefore provides a path for the transcoded data to be sent to the host.

FIG. 1 shows a system including a Solid State Drive (SSD) that may support transcoding of encoded data, according to an embodiment of the inventive concept. In FIG. 1, machine 105, which may be a host computer, may include processor 110, memory 115, and storage device 120. Processor 110 may be any variety of processor. While FIG. 1 shows a single processor 110, machine 105 may include any number of processors, each of which may be single core or multi-core processors, and may be mixed in any desired combination.

Processor 110 may be coupled to memory 115. Memory 115 may be any variety of memory, such as flash memory, Dynamic Random Access Memory (DRAM), Static Random Access Memory (SRAM), Persistent Random Access Memory, Ferroelectric Random Access Memory (FRAM), or Non-Volatile Random Access Memory (NVRAM), such as Magnetoresistive Random Access Memory (MRAM) etc. Memory 115 may also be any desired combination of different memory types, and may be managed by memory controller 125. Memory 115 may be used to store data that may be termed "short-term": that is, data not expected to be stored for extended periods of time. Examples of short-term data may include temporary files, data being used locally by applications (which may have been copied from other storage locations), and the like.

Processor 110 and memory 115 may also support an operating system under which various applications may be running. These applications may issue requests to read data from or write data to either memory 115 or storage device 120. Whereas memory 115 may be used to store data that may be termed "short-term", storage device 120 may be used to store data that is considered "long-term": that is, data expected to be stored for extended periods of time. Storage device 120 may be accessed using device driver 130. Storage device 120 may be of any desired format, such as hard disk drives, Solid State Drives (SSDs), and any other desired format.

Figure 2:
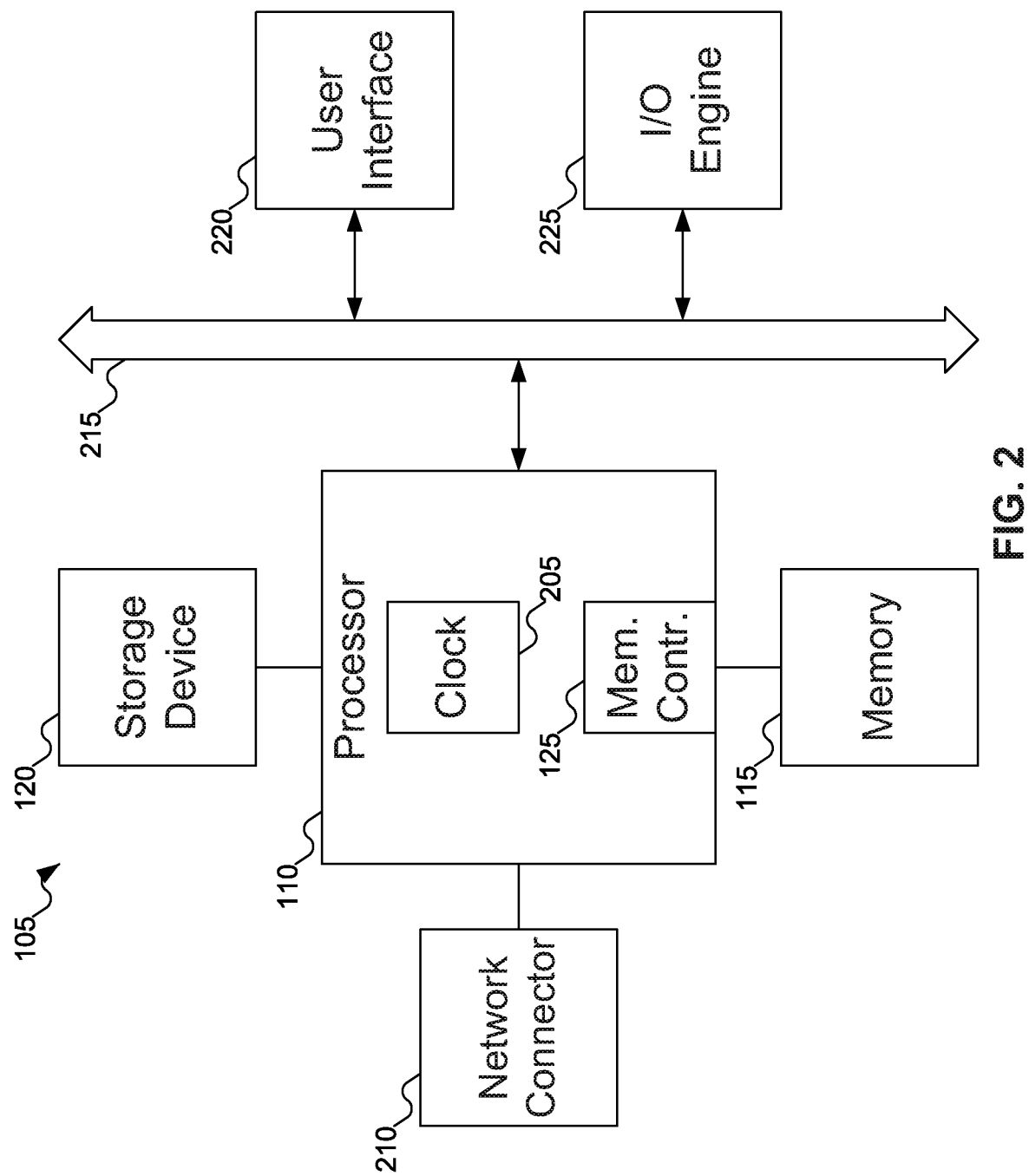
FIG. 2 shows some further details of the machine of FIG. 1.

FIG. 2 shows details of the machine of FIG. 1. In FIG. 2, typically, machine 105 may include one or more processors 110, which may include memory controllers 125 and clocks 205, which may be used to coordinate the operations of the components of the machine. Processors 110 may also be coupled to memories 115, which may include random access memory (RAM), read-only memory (ROM), or other state preserving media, as examples. Processors 110 may also be coupled to storage devices 120, and to network connector 210, which may be, for example, an Ethernet connector or a wireless connector. Processors 110 may also be connected to buses 215, to which may be attached user interfaces 220 and Input/Output interface ports that may be managed using Input/Output engines 225, among other components.

Figure 3:
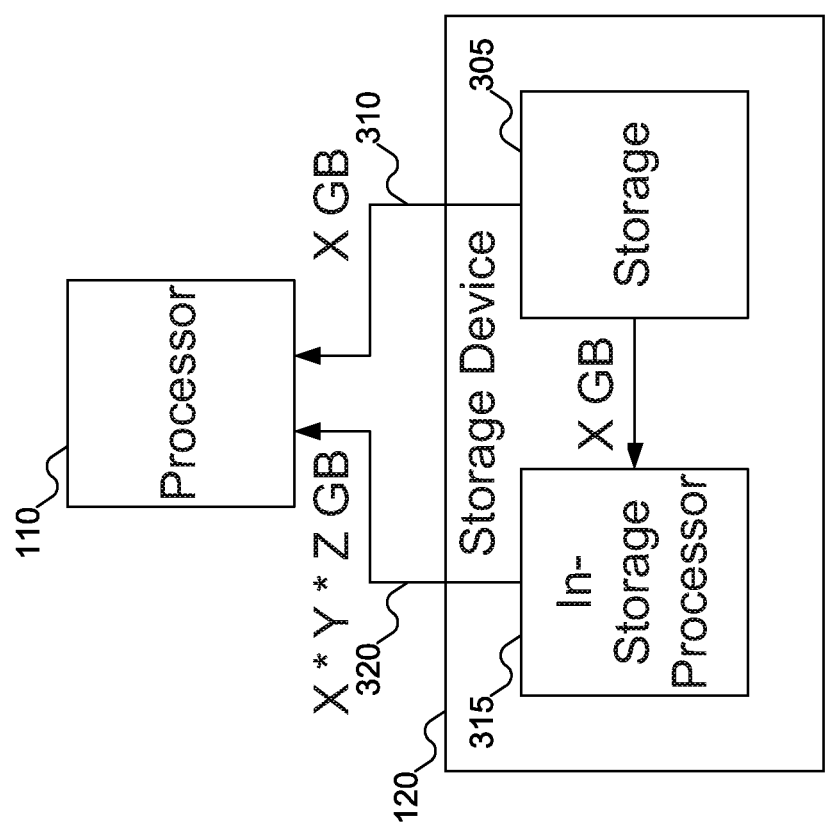
FIG. 3 shows the storage device of FIG. 1 and the processor of FIG. 1 communicating the same data using different approaches.

FIG. 3 shows storage device 120 of FIG. 1 and processor 110 of FIG. 1 communicating the same data using different approaches. In one approach (the conventional approach), data may be sent read from storage 305 (which may be, for example, the platters on a hard disk drive or the flash memory chips in a flash memory storage device, such as an SSD) within storage device 120 and sent directly to processor 110. If the total data stored on storage device 120 (encoded and/or compressed) is X bytes, then that is the amount of data to be sent to processor 110. Note that this analysis considers that amount of storage used to store the encoded and/or compressed data: the unencoded and uncompressed data would presumably be a larger number of bytes (or else there might be no benefit to encoding and/or compressing the data). Thus, for example, if the data may use about 10 GB of storage unencoded and uncompressed, but may use about 5 GB of storage when encoded and/or compressed, then about 5 GB of data, rather than about 10 GB, may be transferred from storage device 120 to processor 110.

It is also possible to consider the transfer of data from storage 120 to processor 110 in terms of the bandwidth offered to transfer data (and consequently the time used to effect the transfer). The total data stored on storage device 120 may be sent at an effective rate of B bytes/second when the data stored on storage device 120 may be sent directly to processor 110 (shown via arrow 310), if the data stored on storage device 120 is encoded and/or compressed. Continuing the earlier example, consider a situation in which the connection between storage device 120 and processor 110 includes about 1 GB/second of bandwidth. Because the encoded and/or compressed data may occupy about 5 GB of space, the encoded and/or compressed data may be sent over an about 1 GB/second connection in a total of 5 seconds. But since the total data stored (before encoding and/or compression) is about 10 GB, the effective transmission rate B of the data is about 2 GB/second (since about 10 GB of unencoded and uncompressed data is sent in about 5 seconds).

In contrast, if in-storage processor 315 were used to pre-process the data in an attempt to reduce the amount of data being sent to processor 110, then less raw data might be sent (since in-storage processor 315 may be more selective about what data is sent). On the other hand, in-storage processor 315 may decompress the data to process it (and possibly decode the data as well). Thus, the amount of data to be sent from in-storage processor 315 to processor 110 may be reduced by the selection of the data, but it may also be increased by the amount of compression (and possibly encoding): algebraically, the amount of data to be sent from in-storage processor 315 to processor 110 (shown via arrow 320) may be expressed as X*Y*Z bytes, where X is the amount of space used to store the encoded and/or compressed data, Y is the compression ratio (by how much data storage is reduced using compression (and possibly encoding)), and Z is the selectivity rate (how much data is selected from the uncompressed data). Similarly, the effective rate at which data may be sent from in-storage processor 315 to processor 110 becomes B*Y*Z bytes/second.

A straightforward comparison of the two formulas shows that using in-storage processor 315 to select data to send to processor 110 is superior when X*Y*Z<X (or B*Y*Z<B): that is, when Y*Z<1. Otherwise, the amount of data to be sent after pre-processing by in-storage processor 315 is greater than the amount of encoded and/or compressed data, even without in-storage processor 315 applying its selectivity: it would be more efficient to just send the original encoded and/or compressed data than for in-storage processor to attempt to select the data to send to processor 110.

Figure 4:
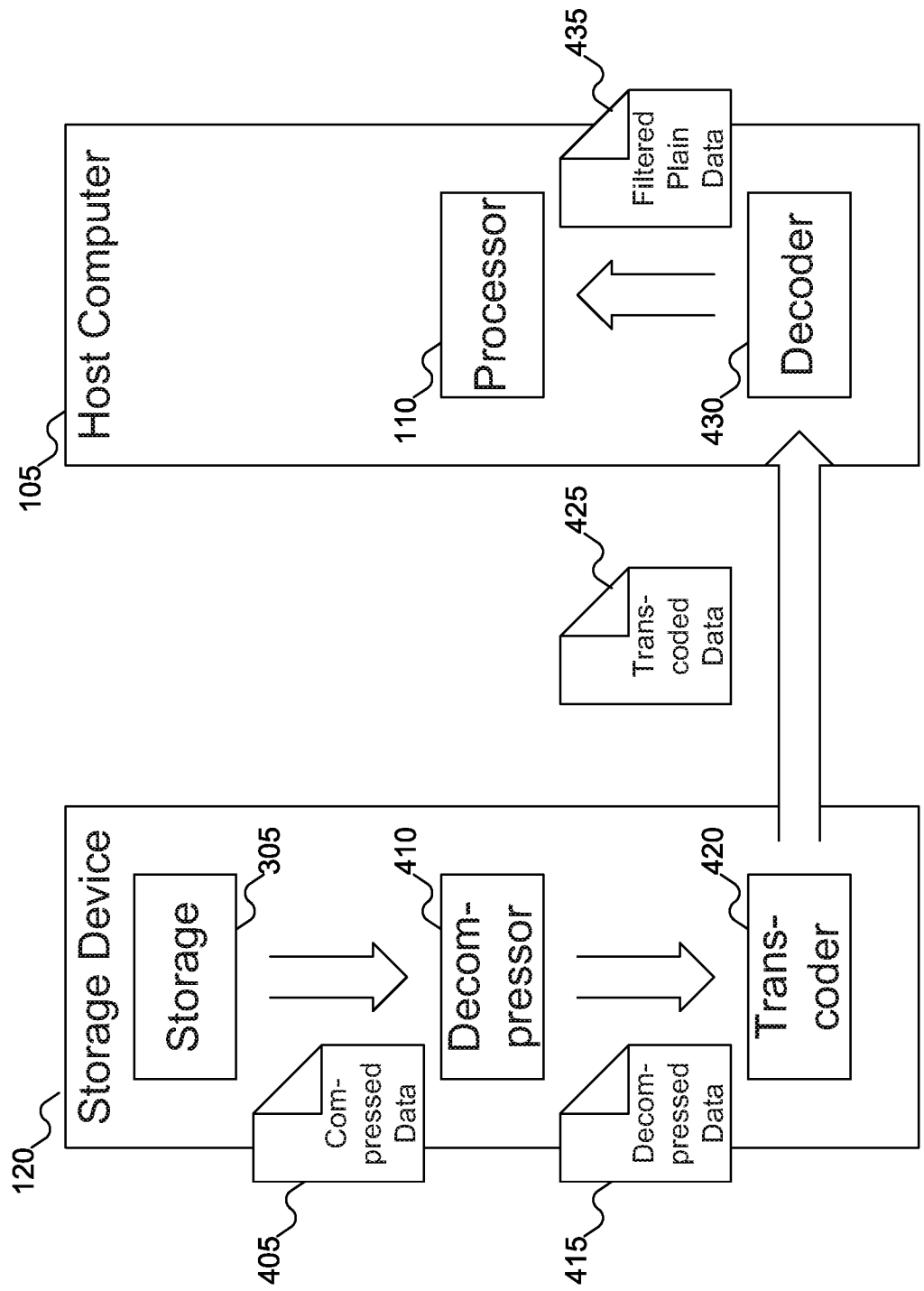
FIG. 4 shows the storage device of FIG. 1 and the processor of FIG. 1 communicating transcoded data, according to an embodiment of the inventive concept.

FIG. 4 shows storage device 120 of FIG. 1 and processor 110 of FIG. 1 communicating transcoded data, according to an embodiment of the inventive concept. In FIG. 4, the encoded and/or compressed data is stored in storage 305 (again, storage 305 may represent the platters in a hard disk drive, the flash memory chips in a flash memory storage device such as an SSD, or some other physical storage for data). This data—compressed data 405—may be passed to decompressor 410, which may decompress the data, producing decompressed data 415. Decompressor 410 (also called a decompression engine) may be implemented using hardware decompression or via software running on an appropriate circuit (such as a general purpose processor, a Field Programmable Gate Array (FPGA), an Application-Specific Integrated Circuit (ASIC), a Graphics Processing Unit (GPU), or a General Purpose GPU (GPGPU)). Decompressed data 415 may still be encoded, since encoding and compression may be separate processes. Decompressed data 415 may then be passed to transcoder 420, which may perform transcoding on the data. Transcoding may be thought of as the process of converting data from one encoding to another.

All of the above processes may occur within storage device 120. But once transcoder 420 has processed decompressed data 415 and produced transcoded data 425, transcoded data 425 may be provided to host computer 105. Decoder 430 may then decode transcoded data 425, thereby producing filtered plain data 435. Filtered plain data 435 may then be provided to processor 110, which may then perform whatever operations are desired on filtered plain data 435.

Note that for decoder 430 to decode transcoded data 425 may involve knowing something about the encoding applied to transcoded data 425. This information may include, for example, the specific encoding scheme used in transcoded data 425, or a dictionary used in transcoded data 425. While FIG. 4 does not show this information being passed from storage device 120 to host computer 105, this information may be passed to host computer 105 in parallel with (or as part of) transcoded data 425. Of course, if transcoded data 425 is actually unencoded and uncompressed (as could happen if the result of transcoder 420 would send a greater number of actual bytes than sending unencoded and uncompressed data), then transcoded data 425 may omit any information about an encoding scheme or a dictionary.

At this point, it may be worth discussing the differences between encoding and compression. The two concepts are related—both involve attempting to reduce the amount of storage used to store data—but there are some differences. Encoding typically involves using a dictionary that provides indices to data that would be lengthy to include directly and have a relatively low number of distinct values. For example, there are approximately 195 different countries. If data stored information about the citizenship of a large number of people, including each person's country of citizenship directly would use a large amount of space: several bytes at least (assuming one byte per character in the name of the country). On the other hand, the values 1-195 may all be represented using a single byte. Using a dictionary to represent the names of the countries, and the storing the index of the appropriate country name in the data, may significantly reduce the amount of data to be stored without losing any information. For example, the information "United States of America, United States of America, Korea, Korea, Korea, Korea, China, India, China, China, China, China, China, United States of America" may be represented instead by the dictionary shown in Table 1, resulting in the information being represented as "3, 3, 2, 2, 2, 2, 0, 1, 0, 0, 0, 0, 0, 3": a reduction from 153 characters to 40 characters. Even factoring in 52 characters for the dictionary, simply using a dictionary results in a significant savings.

TABLE 1

| ID | Country |
| --- | --- |
| 0 | China |
| 1 | India |
| 2 | Korea |
| 3 | United States of America |

The value of a dictionary may decrease the larger the number of values the dictionary becomes. For example, if there are 1,000,000 different possible values, each index may use 20 bits to store the index. Of course, this may still be fewer than the number of bits used to store the values directly, but the benefits of encoding (relative to storing the data unencoded) may be reduced. And if the value stored for each entry in the data could be unique, or if the amount of space used to store the index is approximately the same as the amount of space used to store the values, using encoding with a dictionary could actually increase the amount of data to be stored. Continuing the example of data regarding people, storing their ages using a dictionary is no more efficient than storing the ages directly.

Compression, on the other hand, typically uses coding schemes such as Huffman codes. The data may be analyzed to determine the relative frequency of each datum, with shorter codes assigned to more frequent data and longer codes assigned to less frequent data. Morse code, while not a Huffman code, is a well-known example of a code that uses shorter sequences for more frequent data and longer sequences for less frequent data. For example, the letter "E" may be represented by the sequence "dot" (followed by a space), whereas the letter "J" may be represented by the sequence "dot dash dash dash" (followed by a space). (Because Morse code uses spaces to represent where one symbol ends and another symbol begins, and the sequence for one symbol may be a prefix of the sequence for another symbol (note that "E" is represented by a dot, whereas "J" starts with a dot but includes other symbols), Morse code is not a proper Huffman code. But many people are familiar with Morse code to some extent, making it a more generally useful example of a code that uses shorter symbols for more frequent data and longer symbols for less frequent data.)

Returning to encoding schemes, once a dictionary is established, there are a number of different encoding schemes that may be used to further encode the data. Examples of such encoding schemes include Run Length Encoding, Bit Packing, Prefix Encoding, Cluster Encoding, Sparse Encoding, and Indirect Encoding: embodiments of the inventive concept may also use other encoding schemes. Run Length Encoding and Bit Packing are discussed here as they are used later in various examples; information about the other encoding schemes may be easily located.

Run Length Encoding (RLE) relies on the premise that values often occur in groups. Instead of storing each value separately, a single copy of the value may be stored, along with a number that represents how often that value occurred in the data. For example, if the value "2" occurred four times in a row, rather than storing the value "2" four times (which may use four bytes of storage) the value "2" may be stored along with the number of occurrences ("4") of that value (which may use two bytes of storage). Thus, continuing the above example, the sequence "3, 3, 2, 2, 2, 2, 0, 1, 0, 0, 0, 0, 0, 3" may be represented by "[2, RLE], 3, [4, RLE] 2, [1, RLE] 0, [1, RLE], 1, [5, RLE], 0, [1, RLE], 3". The encoding "[2, RLE], 3" may be understood to mean that there is information encoded using RLE: the value is "3", and that value is repeated two times; the other RLE encodings are similar. (The reason that the representation includes an indicator that RLE encoding is used relates to the potential use of hybrid encoding schemes, discussed with reference to FIG. 7 below.) This sequence may use a total of 12 bytes: for each encoding, one byte stores the number of times the next value is repeated, and one byte stores the value to be repeated.

As compared with 14 bytes to store the original sequence, 12 bytes is not a large reduction in the amount of space to store the data. But proportionately, this encoding represents about a 14% reduction in the amount of storage needed for this data. Even about a 14% reduction in the storage used by data that occupies about 5 GB is a significant savings: about 700 MB may be saved.

As an alternative to the number of occurrences of each value, the start position of each group may be stored. When the start positions are used instead of a count of the number of occurrences of each value, the data may be represented as "[0, RLE], 3, [2, RLE] 2, [6, RLE] 0, [7, RLE], 1, [8, RLE], 0, [13, RLE], 3".

The above discussion describes a situation in which the value being repeated using RLE fits into a single byte. What if that were not the case: for example, what if the value being repeated was "1000" ("1000" may use 10 bits to store)? In that case, RLE may serialize the value in groups of seven bits. The eighth bit in each byte, which may be the most significant bit in the byte, may represent whether the byte is continued in another byte or not.

As an example, consider the value "1000". In binary, the value "1000" may be represented as "11 1110 1000". Since this representation uses 10 bits, the value may be too large to be stored in a single byte. So the value may be broken into groups of seven bits (leading zeroes are added so that each group contains seven bits): "0000111 1101000". Now, the first byte in the sequence may be prepended with a "1" to indicate that the value it represents is continued in the next byte, and the second byte in the sequence may be prepended with a "0" to indicate that the value ends with that byte. Thus, the bit sequence becomes "10000111 01101000". When the system reads this bit sequence, the system may know to look at the most significant bit in each byte to determine whether the value continues beyond that byte or ends with that byte, and to remove that bit when reassembling the bit sequence into a value. Thus, "10000111 01101000" becomes "0000001111101000" (with two additional leading zeroes added to bring the representation up to a full two bytes), permitting recovery of the original value "1000".

Of course, if one bit in each byte is used to identify whether the byte is a continuation of a value or not, then that bit may not be used as part of the value. Thus, even if a value might fit into a single byte, an additional bit that indicates that the value is not continued in another byte may be included. Additionally, if the value would fit in eight bits but not in seven bits (for example, a value between 128 and 255), then two bytes may be used to represent the full value when using the bits that indicate whether or not a value continues in the next byte (since the most significant bit of the value would shift to the next group of seven bits in the encoding).

When using RLE, the bits and/or bytes may be presented in any desired order. For example, the bits may be presented from most significant bit to least significant bit, or from least significant bit to most significant bit; the bytes may be similarly ordered in either manner. Thus, for example, where bytes are presented from least significant to most significant, but bits in each byte are presented from most significant to least significant, and using continuation bits, the value "16384" may be encoded as "10000000 10000000 00000001". This bit sequence may be interpreted as follows: the first bit in each byte is the continuation bit (with "1" indicating that the next byte continues the value, and "0" indicating that the value is not continued in the next byte). After removing the continuation bits, what remains is "0000000 0000000 0000001". When the bytes are reordered from most significant to least significant (and restructured into conventional groups of eight bits, discarding leading zeroes), the value becomes "01000000 00000000", which is binary for the value "16384".

Bit Packing, on the other hand, takes advantage of the idea that a value may use fewer bits than an entire byte. For example, if the values to be stored include 0, 1, 2, and 3, then two bits may be used to represent each value. While a full byte may be used to store each value, using a full byte means that 75% of the storage is actually not being used. Bit Packing capitalizes on this phenomenon by storing more than one value in a single byte (or sequence of bytes). Bit Packing is particularly advantageous when sequences of values repeat rather than a single value.

As an example, consider the sequence "0, 1, 0, 1, 0, 1, 0, 1", and consider a situation in which about four bits are used to uniquely identify each value (that is, no value larger than 15 is used). Instead of storing each value separately (requiring a total of eight bytes), the encoding "[4, BP] 0, 1" may be used. This encoding represents that a single byte stores four bits representing the value "0" and four bits representing the value "1", and that byte is then repeated four times. (As with RLE encoding, the Bit Packing encoding may include an indicator that the data is encoded using Bit Packing for use in hybrid encoding schemes.) The first byte represents the number of times the data in the group is to be repeated; the second byte stores the values in group itself. This encoding may use about two bytes to store the data, resulting in about a 75% reduction in the amount of storage used for the sequence.

When using Bit Packing, the data may be packed in any desired manner. For example, when packing the sequence "0, 1" where each value uses four bits, the sequence may be represented as "00010000" (packing the values from the least significant bit to the most significant bit) or as "00000001" packing the values from the most significant bit to the least significant bit). Some implementations of Bit Packing may use either strategy but then reverse the order in which the bits are placed into the stream (so that what amounts to the least significant bit comes through first). Other techniques may also be used to pack the bits in Bit Packing.

Of course, Bit Packing does not limit groups that may fit into a single byte. As with RLE, the value in Bit Packing may use a bit to identify whether a value continues in the next byte or not.

Because encoding and compression both attempt to reduce the amount of space used to store a representation of the data, their benefits may not be multiplicative. Both encoding and compression attempt to reduce the amount of space used to store data. But once data has been compacted in one manner (such as encoding), applying further compacting schemes (such as compression) may be less helpful. Compression may be applied to data after the data is encoded and may still provide some reduction in the amount of storage space used, but the impact of compression on encoded data may be less than the benefit of compression on unencoded data. (If every scheme to compact data could be applied with equal benefit regardless of the data being compacted, one could hope to reduce any data down to a ridiculously small size simply by applying repeated compaction schemes. As should be readily apparent after a little thought, such a result is not realistic in the real world.)

Figure 5:
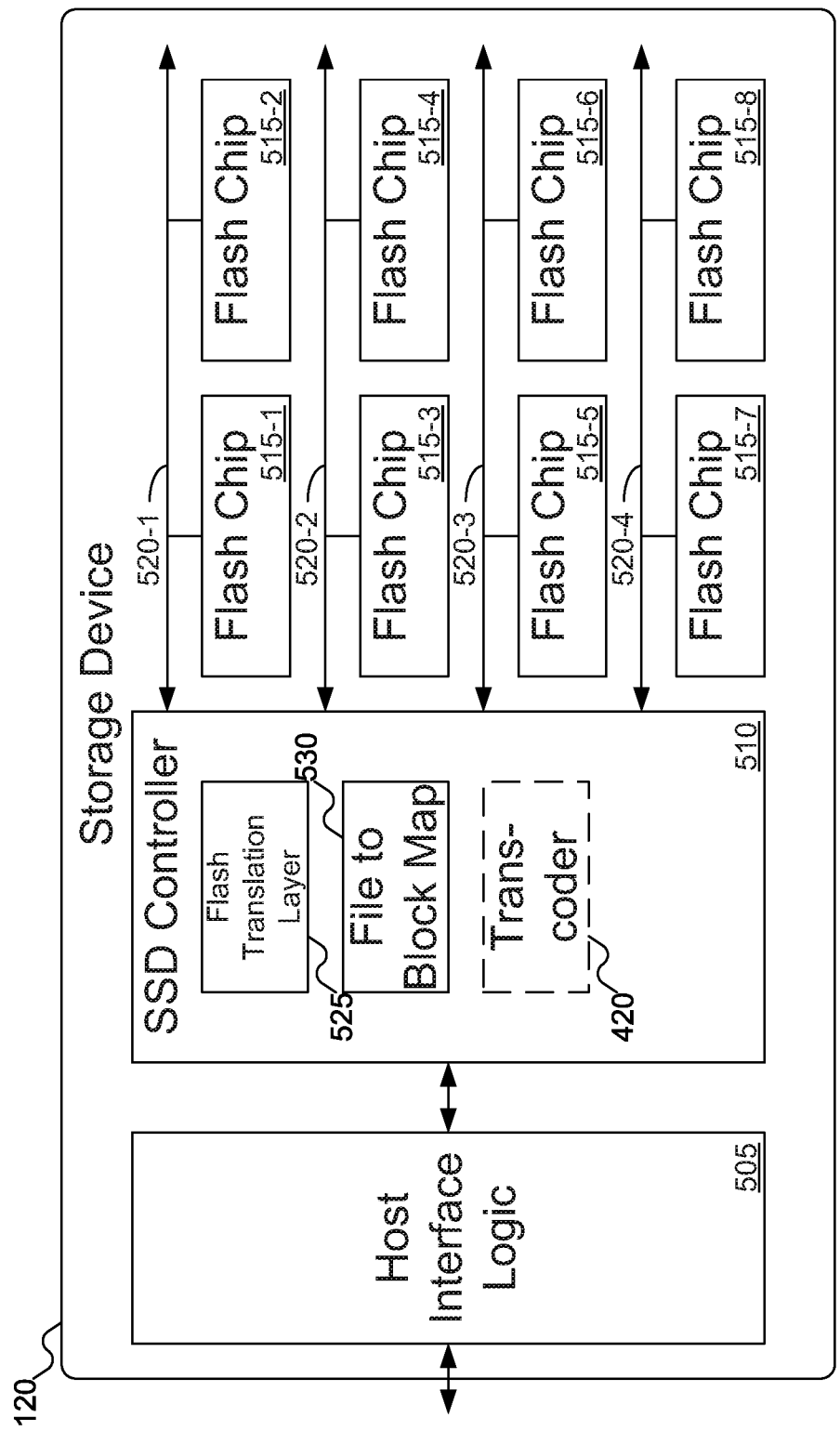
FIG. 5 shows details of the storage device of FIG. 1, according to an embodiment of the inventive concept.

FIG. 5 shows details of storage device 120 of FIG. 1. In FIG. 5, storage device 120 is shown as an SSD, but embodiments of the inventive concept may support other forms for storage device 120 with appropriate modifications. In FIG. 5, storage device 120 may include host interface layer (HIL) 505, SSD controller 510, and various flash memory chips 515-1 through 515-8 (also termed "flash memory storage"), which may be organized into various channels 520-1 through 520-4. Host interface logic 505 may manage communications between storage device 120 and machine 105 of FIG. 1. These communications may include read requests to read data from storage device 120 and to write data to storage device 120. SSD controller 510 may manage the read and write operations, along with garbage collection and other operations, on flash memory chips 515-1 through 515-8 using a flash memory controller (not shown in FIG. 5).

SSD controller 510 may include translation layer 525 (also called a flash translation layer (FTL)). Translation layer 525 may perform the function of translating logical block addresses (LBAs) as provided by machine 105 of FIG. 1 into physical block addresses (PBAs) on SSD 120 where the data is actually stored. In this manner, machine 105 of FIG. 1 may use its own address space to reference data, without having to know the physical addresses on storage device 120 where the data is actually stored. This may be beneficial when, for example, data is updated: since storage device 120 may not update data in place, storage device 120 may invalidate the existing data and write the update to a new PBA on storage device 120. Or, if the data is stored in a block that is selected for garbage collection, the data may be written to a new block on storage device 120 before the block is erased. By updating translation layer 525, machine 105 of FIG. 1 is insulated from where the data is actually stored as data is moved to different PBAs.

SSD controller 510 may also include file to block map 530. File to block map 530 may specify which blocks are used to store data for which files. File to block map 530 may be used, for example, when data is stored in a columnar format. File to block map 530 may be part of translation layer 525 (in which case file to block map 530 may not be considered a separate component of storage device 120), or it may supplement translation layer 525 (for example, translation layer 525 might be used for data that uses a relatively fewer number of blocks, whereas file to block map might be used for data taking a relatively greater number of blocks), or it may completely replace translation layer 525 (in which case translation layer 525 may not be present in SSD controller 510).

SSD controller 510 may also include transcoder 420. But embodiments of the inventive concept may include configurations with transcoder 420 somewhere else within storage device 120 (for example, transcoder 420 may be implemented using a general purpose processor (running suitable software), a FPGA, an ASIC, a GPU, or a GPGPU somewhere within storage device 120, among other possibilities), or even external to storage device 120.

Storage device 120 may also include in-storage processor 315 of FIG. 3 (not shown in FIG. 5), which may execute instructions that govern how to use data stored on storage device 120. In-storage processor 315 of FIG. 3 may also be used for in-storage compute functionality, to execute operations locally on storage device 120 instead of on processor 110 of FIG. 1. Like transcoder 420, in-storage processor 315 of FIG. 3 may be implemented using a general purpose processor (running suitable software), an FPGA, an ASIC, a GPU, or a GPGPU somewhere within storage device 120, among other possibilities), or even external to storage device 120.

While FIG. 5 shows storage device 120 as including eight flash memory chips 515-1 through 515-8 organized into four channels 520-1 through 520-4, embodiments of the inventive concept may support any number of flash memory chips organized into any number of channels. Similarly, while FIG. 5 shows that SSD controller 510 may include transcoder 420 and/or in-storage processor 315 of FIG. 3, embodiments of the inventive concept may be configured with transcoder 420 or in-storage processor 315 of FIG. 3 other than as shown in FIG. 5.

Figure 6:
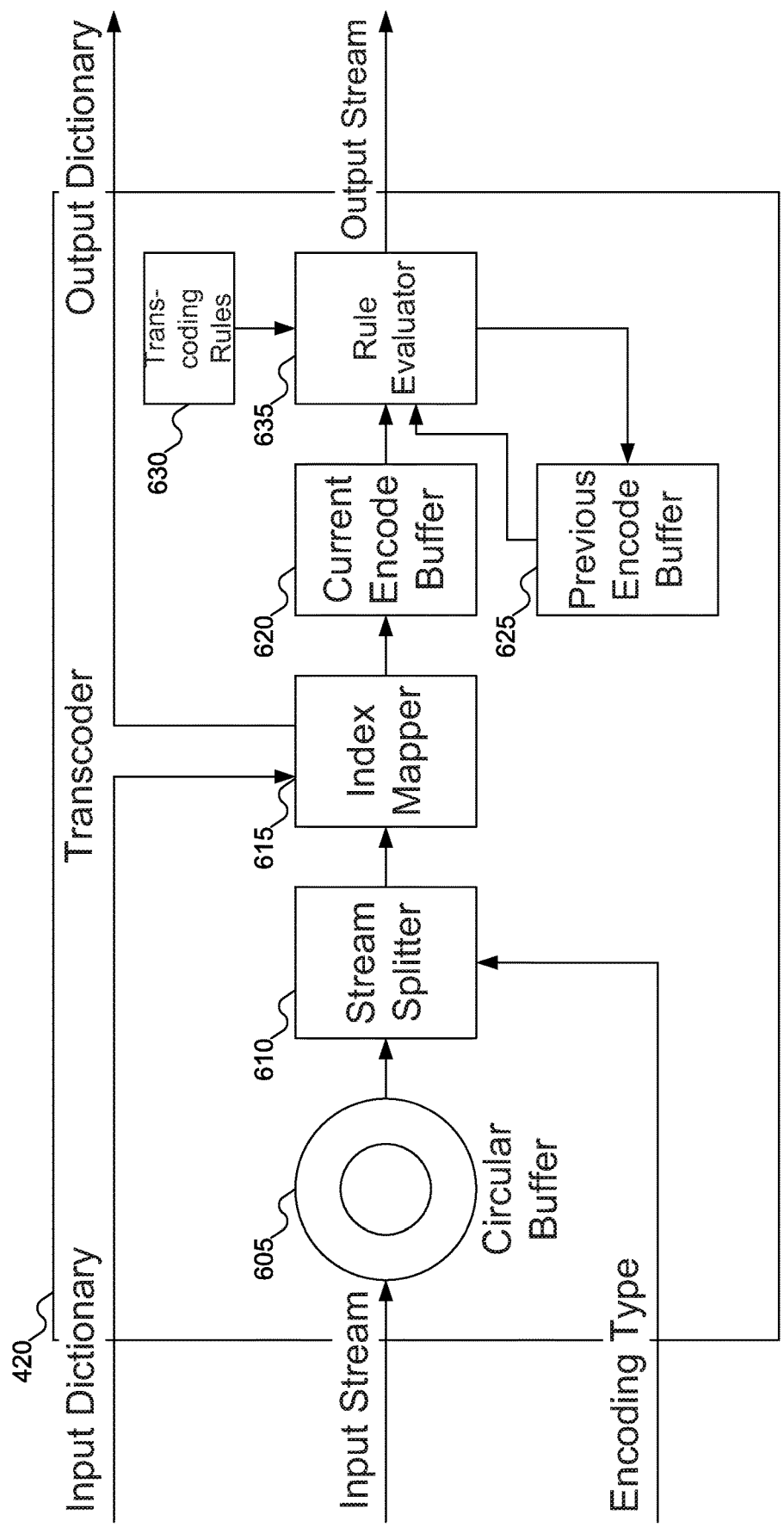
FIG. 6 shows details of the transcoder of FIG. 4, according to an embodiment of the inventive concept.

FIG. 6 shows details of transcoder 420 of FIG. 4. In FIG. 6, transcoder 420 may receive various inputs, such as an input dictionary, an input stream, and an encoding type, and produce various outputs, such as an output dictionary and an output stream. In short, transcoder 420 may operate to take the input stream, which may be encoded using an encoding scheme specified by the encoding type, and may produce the output stream. (While the input stream may be encoded, the discussion below considers a situation in which the input stream is not compressed: if the input stream is compressed then the input stream may be decompressed before further processing.) The output stream may be encoded using the same encoding scheme as the input stream, or the output stream may encoded using a different encoding scheme (or both: as discussed below, when a hybrid encoding scheme is used some data may be changed from one encoding scheme to another encoding scheme).

In addition, even if the encoding scheme is unchanged between the input stream and the output stream, the encoding itself may change. For example, if a particular value is assigned to different indices in the input and output dictionaries, then that change in the dictionaries should be reflected in the values used in the actual data. To that end, transcoder 420 may also take the input dictionary and map it to the output dictionary.

TABLE 2

| ID | Country |
|---|---|
| 0 | Don't Care |
| 1 | United States of America |

As an example of these last two points, consider again the dictionary shown in Table 1 above. Now considers a situation in which host computer 105 of FIG. 1 was interested in data about citizens of the United States of America. Table 1 may be viewed as the input dictionary, as it represents the data being received in the input stream. Table 2, on the other hand may be the output dictionary, representing the data in the output stream. There are at least three points to note about Table 2. First, Table 2 includes two entries, as compared to the four entries shown in Table 1. Second, Table 2 includes an entry labeled "Don't Care" (although any other name may be used, since the data represented by the corresponding value is not of interest at this time to host computer 105 of FIG. 1). Third, while "United States of America" had ID 3 in Table 1, "United States of America" has ID 1 in Table 2. This last point implies that any reference to ID 3 in the input stream may be changed to reference ID 1 in the output stream (or else the data could be meaningless).

To accomplish these operations, transcoder 420 may include various components. Transcoder 420 may include circular buffer 605, stream splitter 610, index mapper 615, current encode buffer 620, previous encode buffer 625, transcoding rules 630, and rule evaluator 635.

Circular buffer 605 may receive the data stream coming from storage 305 of FIG. 3 within storage device 120 of FIG. 1. As the entirety of the data to be processed may be large (for example, several gigabytes or terabytes of data), attempting to load all the data at one time and process it within some storage as a unit may be impractical. Thus, the input stream may be received as a stream and buffered, permitting the data to be processed in smaller units than the entire data set. While FIG. 6 shows buffer 605 as a circular buffer, embodiments of the inventive concept may use any type of buffer to store the data as received from the input stream.

Stream splitter 610 may take data from circular buffer 605 and divide that data into chunks. The chunks may then be passed to index mapper 615. A chunk may represent the unit of data to be processed by the other components within transcoder 420, and should not be confused with the term "chunk" as that term might be used in other context (for example, "column chunk" as that term may be used with reference to FIG. 9 below).

Figure 7:
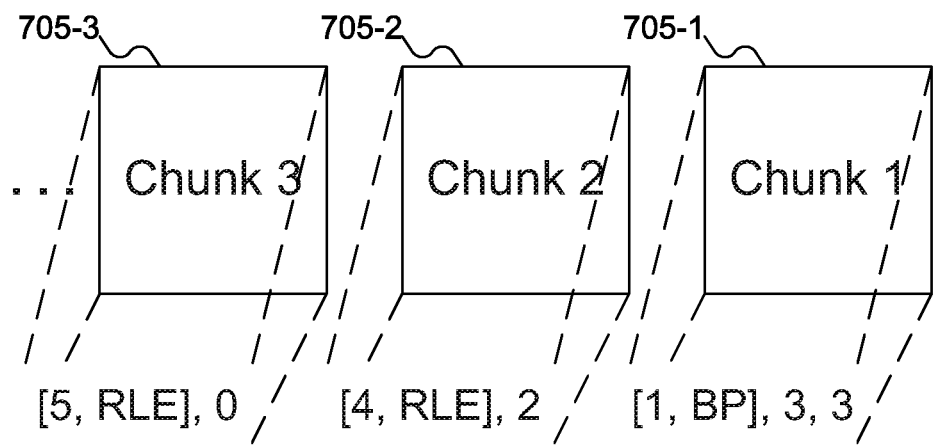
FIG. 7 shows the stream splitter of FIG. 6 dividing an input encoded data into chunks, according to an embodiment of the inventive concept.

FIG. 7 shows stream splitter 610 of FIG. 6 dividing an input encoded data, which may be part (or all) of the input stream, into chunks. In FIG. 7, the input data is shown as including, among other data, three pieces of encoded data: "[1, BP], 3, 3, [4, RLE], 2, [5, RLE], 0". As discussed above, these chunks represent data encoded using the Bit Packing and RLE encoding schemes. This encoding represents the following (unencoded) sequence of values: "3, 3, 2, 2, 2, 2, 0, 0, 0, 0, 0". For each separate encoding, it is possible that host computer 105 of FIG. 1 might be interested in that data (or part of that data), or host computer 105 of FIG. 1 might not be interested in that data. Whether host computer 105 of FIG. 1 may be interested in the values in each encoding may depend on transcoding rules 630: stream splitter 610 of FIG. 6 may not know what data host computer 105 of FIG. 1 may be interested in. So, stream splitter 610 of FIG. 6 may divide the input data stream into chunks, with each chunk including a different piece of encoded data. Thus, chunk 705-1 may include the encoding "[1, BP], 3, 3", chunk 705-2 may include the encoding "[4, RLE], 2", and chunk 705-3 may include the encoding "[5, RLE], 0".

There are at least two additional points about FIG. 7 worth noting. First, note also that in the example input stream shown in FIG. 7, some data is encoded using Bit Packing and some data is encoded using RLE. If all data is encoded using a single encoding scheme (for example, RLE), then stream splitter 610 of FIG. 6 may determine that fact from the encoding type input to transcoder 420 of FIG. 6. But sometimes a hybrid encoding scheme is used. In a hybrid encoding scheme, some data may be encoded using one encoding scheme (such as RLE), and some data may be encoded using another encoding scheme (such as Bit Packing) (the concept may also generalize to more than two encoding schemes used in a hybrid encoding scheme). In a hybrid encoding scheme, transcoder 420 of FIG. 6 may not receive an encoding type as an input, as that information alone does not tell stream splitter 610 of FIG. 6 what data is encoded with which encoding scheme. Instead, stream splitter 610 of FIG. 6 may determine what encoding scheme is used for each chunk by looking at the chunk itself.

One way to determine the encoding scheme used to encode a particular chunk may be by examining the value of a particular bit in the chunk. For example, a columnar storage format may use the least significant bit in the first byte to indicate whether a particular chunk of data may be encoded using RLE or Bit Packing: if the value of that bit may be "0" RLE may be used, and if the value of that bit may be "1" then Bit Packing may be used. This bit may then be removed from the byte and the remaining bits logically shifted one bit to the right to produce the value used by the encoding.

For example, consider chunk 705-1. Chunk 705-1 would include the bit sequence "00000011 00110011". When stream splitter 610 of FIG. 6 reads the first byte "00000011", stream splitter 610 of FIG. 6 may examine the least significant bit (the last "1"). Because the least significant bit may be "1", stream splitter 610 of FIG. 6 may determine that this chunk may be encoded using Bit Packing. This least significant bit may be removed and the remaining bits in the first byte logically shifted to the right by one bit, producing the byte "00000001". Since the first (most significant) bit of this byte may be "0", stream splitter 610 of FIG. 6 may determine that the byte may be just "00000001" (the "0" bit indicating that the value may be not continued in the next byte may be removed and another leading zero added), indicating that the group (still to be determined) may be repeated one time. Stream splitter 610 of FIG. 6 may then read the next byte "00110011". Since the most significant bit of this byte may be "0", stream splitter 610 of FIG. 6 knows that this value does not continue into the next byte. The continuation bit may be removed and a leading zero added, producing the value "00110011", which represents the values "3" and "3". Thus, stream splitter 610 of FIG. 6 may determine that the encoding uses Bit Packing to represent that the value "3" may be repeated two times.

On the other hand, consider chunk 705-2. Chunk 705-2 would include the bit sequence "00001000 00000010". When stream splitter 610 of FIG. 6 reads the first byte "00001000", stream splitter 610 of FIG. 6 may examine the least significant bit (the last "0"). Because the least significant bit may be "0", stream splitter 610 of FIG. 6 may determine that this chunk may be encoded using RLE. This least significant bit may be removed and the remaining bits in the first byte logically shifted to the right by one bit, producing the byte "00000100". Since the first (most significant) bit of this byte may be "0", stream splitter 610 of FIG. 6 may determine that the byte may be just "00000100" (the "0" bit indicating that the value may be not continued in the next byte may be removed and another leading zero added), indicating that the value (still to be determined) may be repeated four times. Stream splitter 610 of FIG. 6 may then read the next byte "00000010". Since the most significant bit of this byte may be "0", stream splitter 610 of FIG. 6 knows that this value does not continue into the next byte. The continuation bit may be removed and a leading zero added, producing the value "00000010". Thus, stream splitter 610 of FIG. 6 may determine that the encoding uses RLE to represent that the value "2" may be repeated four times.

Of course, stream splitter 610 of FIG. 6 may not do all of this analysis for either bit sequence. All stream splitter 610 of FIG. 6 may do would be to read bytes until it encounters a byte with a "0" as the most significant bit (this sequence of bytes would indicate the encoding scheme and the number of repetitions of the coming value), then read bytes until it encounters another byte with a "0" as the most significant bit (this sequence of bytes would represent the value(s) being encoded). Stream splitter 610 of FIG. 6 may then pass those read bits (representing the entirety of the encoded chunk) to index mapper 615 of FIG. 6 (and for later processing by rule evaluator 635 of FIG. 6): index mapper 615 of FIG. 6 (and/or rule evaluator 635 of FIG. 6) may perform the described analysis to determine what encoding scheme is used for the chunk and what value(s) is/are so encoded. But if stream splitter 610 of FIG. 6 (or index mapper 615 of FIG. 6, or any other component of the inventive concept) performs the analysis to determine the encoding scheme used to encode a particular chunk of data, stream splitter 610 of FIG. 6 (or index mapper 615 of FIG. 6, or the other component) may pass the encoding type to other components down the line, to avoid repeating such analysis. This operation may be particular important where the bits that identify the encoding scheme are removed from the chunk as the chunk is processed: without the encoding type, components that process the encoded data later may not be able to process the encoded data correctly.

Second, note that chunks 705-2 and 705-3 represent consecutive chunks both encoded using RLE. It might be expected that stream splitter 610 of FIG. 6 would consider all consecutive RLE encodings to be a single chunk (separating chunks based on using different encoding schemes). But recall that the objective is to transcode the input stream so that all data that is not of interest is coalesced into a single "don't care" value. Recall that stream splitter 610 of FIG. 6 may not have information about what data is of interest to host computer 105 of FIG. 1. If stream splitter 610 of FIG. 6 considered all encodings using the same encoding scheme to be the same chunk, stream splitter 610 of FIG. 6 might end up mixing data that was of interest to host computer 105 of FIG. 1 with data that was not of interest to host computer 105 of FIG. 1. In addition, if all data in the input stream were encoded using the same encoding scheme, then the entire input stream would be considered a single chunk, which would obviate the utility of stream splitter 610 of FIG. 6 as part of transcoder 420 of FIG. 6.

Third, while the above discussion focuses on a hybrid encoding scheme that uses one bit to distinguish between two different encoding schemes, embodiments of the inventive concept may be generalized to hybrid encoding schemes that use more than two distinct encoding schemes. Of course, if more than two encoding schemes are used, then more than one bit may be used to distinguish among the different encoding schemes. For example, if three or four encoding schemes are used then two bits may be used to differentiate among the encoding schemes, if five, six, seven, or eight different encoding schemes are used then three bits may be used to distinguish among the different encoding schemes, and so on.

(Note too that the bits used to distinguish among the encoding schemes may be used for other purposes as well. For example, consider the situation where three encoding schemes are used. If the least significant bit of the first byte has a particular value (such as "0"), then one encoding scheme, such as RLE, may be used, with the next least significant bit used to represent the value. But if the least significant bit of the first byte as another particular value (such as "1"), then the next least significant bit may be used to distinguish between the remaining two encoding schemes (such as Bit Packing and Cluster Encoding).)

Returning to FIG. 6, index mapper 615 may receive a chunk from stream splitter 610. Index mapper may then map the encoded values from the input dictionary to encoded values in the output dictionary. For example, consider again the dictionaries shown in Table 1 and Table 2 above. Since the value corresponding to "United States of America" may be of interest, the value "3", when encountered in an encoded chunk, may be replaced with the value "1"; all other values, when encountered in an encoded chunk, may be replaced with the value "0".

Figure 8:
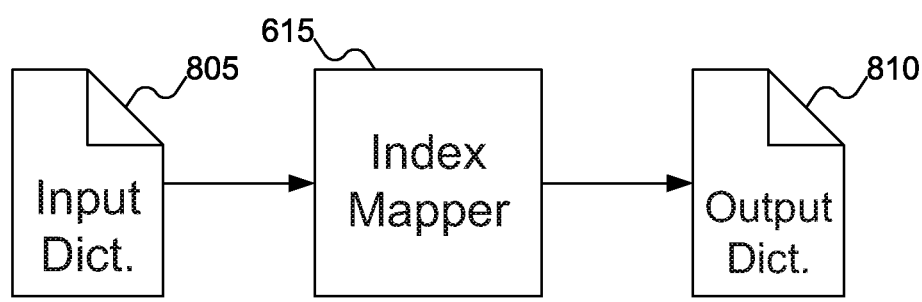
FIG. 8 shows the index mapper of FIG. 6 mapping an input dictionary to an output dictionary, according to an embodiment of the inventive concept.

FIG. 8 shows the index mapper of FIG. 6 mapping an input dictionary to an output dictionary. In FIG. 8, index mapper 615 is shown receiving input dictionary 805 and generating output dictionary 810. Given information about what data is of interest to host computer 105 of FIG. 1, index mapper may generate output dictionary 810. Index mapper may also generate a map from input dictionary 805 to output dictionary 810. Continuing the above example, this map may specify the mapping shown in Table 3. As may be seen, the index "3" may map to the index "1"; all other indices may map to index "0".

TABLE 3

| Input Index | Output Index |
|---|---|
| 0 | 0 |
| 1 | 0 |
| 2 | 0 |
| 3 | 1 |

There are some points worth noting about index mapper 615. First, while index mapper 615 is shown as a separate component of transcoder 420 of FIG. 6, index mapper 615 may work in conjunction with (or be implemented as part of) rule evaluator 635 of FIG. 6. Second, how index mapper 615 may generate output dictionary 810 (and the map shown in Table 3) may depend upon what data is of interest to host computer 105 of FIG. 1. How index mapper may learn what data is of interest to host computer 105 of FIG. 1 is discussed with reference to FIG. 11 below. Third, transcoding data may involve both index mapper 615 mapping input dictionary 805 to output dictionary 810 and transcoding rules 630 of FIG. 630: transcoding rules 630 of FIG. 6 may depend on the map from input dictionary 805 to output dictionary 810. The reverse is not true: the map from input dictionary 805 to output dictionary 810 (and therefore the operation of index mapper 615) may be generated without reference to transcoding rules 630 of FIG. 6.

The third point about index mapper 615 is more subtle. Note that index mapper 615 effectively adds a new entry to output dictionary 810: the "don't care" value. For simplicity of implementation, it makes sense for index mapper 615 to always use the same index for the "don't care" value. Since the size of input dictionary 805 may vary depending on the data set, the index "0" may always be used.

But what happens if it turns out that all data in the data set of interest to host computer 105 of FIG. 1? In that case, index mapper 615 has added an entry to output dictionary 810, but no entry in output dictionary 810 has been removed. These two facts in combination mean that output dictionary 810 may be larger (by one entry) than input dictionary 805. Consider the situation where input dictionary 805 has exactly 2n entries for some value of n. This fact means that every index into input dictionary 805 may be represented using n bits. Adding the "don't care" entry to output dictionary 810 means that there are now 2n+1 entries in output dictionary 810, which means that n+1 bits are now used to represent all possible values in the data set: this problem is called bit overflow. This additional bit may affect the encoded data, requiring new bits to be added to properly represent the data. Thus, a single small change to output dictionary 810 may have a tremendous ripple effect on data representation, and could cause a significant increase in the amount of storage used to represent the encoded data.

While the above example focuses on the situation where the introduction of the "don't care" entry adds a new bit to represent all possible indices into output dictionary 810, a similar problem may occur even when the size of output dictionary 810 is increased to the point that new bits may be used to represent all possible indices. Consider again the input dictionary shown in Table 1, and considers a situation in which host computer 105 of FIG. 1 is interested in citizens of China and India (indices "0" and "1" in Table 1). These indices may be represented using a single bit (since one bit may be used to represent the values "0" and "1"). If these values are encoded using Bit Packing, eight such values could be packed into a single byte. But if the index "0" is assigned to the "don't care" value in output dictionary 810, then the indices for China and India would map to other values (for example, "1" and "2"). Since the value "2" uses two bits, it may no longer be possible to pack eight values into a single byte: a bit overflow has occurred.

There are a few solutions to the problem of bit overflow that may be used. One is to check to see if any indices into input dictionary 805 represent data that is not of interest to host computer 105 of FIG. 1. If it turns out that all data in input dictionary 805 is of interest to host computer 105 then there is no point in transcoding the input stream at all, and the input stream may be mapped directly to the output stream without modification.

But this solution, while useful, may not be enough, since the problem of bit overflow in Bit Packing could still occur. To avoid bit overflow in Bit Packing, the solution may be to ensure that the number of bits used to represent any indices in output dictionary 810 is no greater than the number of bits used to represent any indices in input dictionary 805. Two possible solutions are described here. One solution may be to assign the highest possible index in output dictionary 810 to the "don't care" value: that is, first map all indices of interest from input dictionary 805 to output dictionary 810, then use the lowest unused index for the "don't care" value. The other solution may be to identify an index in input dictionary 805 that is not of interest to host computer 105 of FIG. 1, and use that index as the "don't care" value. In both solutions, no index into input dictionary 805 is ever replaced with a larger index in output dictionary 810, which may avoid bit overflow problems. The disadvantage of such solutions is that it may not be possible to select an index for the "don't care" that is independent of input dictionary 805.

Returning again to FIG. 6, the current chunk (possibly processed by index mapper 615) may be stored in current encode buffer 620. From there, rule evaluator 635 may evaluate the encoded data in current encode buffer 620, along with the encoded data in previous encode buffer 625, and determine whether the encoding should be changed and what data should be output to the output stream. In short, rule evaluator may determine whether the encoded data in current encode buffer 620 may be combined with the encoded data in previous encode buffer 625. If yes, then the encoded data in current encode buffer 620 may be added to the encoded data in previous encode buffer 625; otherwise, the encoded data in previous encode buffer 625 may be output to the output stream and the encoded data in current encode buffer 620 may be moved to previous encode buffer 625. (This analysis considers a situation in which there is data in previous encode buffer 625. If previous encode buffer 625 contains no data, as may occur for example with the first chunk of data, then there is no concern about attempting to combine the encoded data in current encode buffer 620 with transcoded data in previous encode buffer 625.)

This leads to the next question: when may encoded data be combined? The short answer is that chunks of encoded data may be combined when the chunks both represent data that host computer 105 of FIG. 1 is interested in, or data that host computer 105 is not interested in. Some examples may help to illustrate how rule evaluator 635 operates. In both examples, the input stream includes the same data: "[1, BP], 3, 3, [4, RLE], 2, [1, BP], 0, 1, [5, RLE], 1, [1, BP], 3", and the input dictionary is as shown in Table 1. In both examples, a row represents a "snapshot" of what is in current encode buffer 620 and previous encode buffer 625, and what has been output to the output stream at that time.

In the first example, host computer 105 of FIG. 1 has requested data regarding citizens of the United States of America. As may be seen in Table 1, the index for "United States of America" is "3". Thus, the output dictionary may be as shown in Table 2.

TABLE 4

| Row | Current Encode Buffer | Previous Encode Buffer | Output Stream |
| --- | --- | --- | --- |
| 1 | [1, BP], 3, 3 | | |
| 2 | [4, RLE], 2 | [1, BP], 1, 1 | |
| 3 | [1, BP], 0, 1 | [4, RLE], 0 | [1, BP], 1, 1 |
| 4 | [5, RLE], 1 | [6, RLE], 0 | [1, BP], 1, 1 |
| 5 | [1, BP], 3 | [11, RLE], 0 | [1, BP], 1, 1 |
| 6 | | | [1, BP], 1, 1, [11, RLE], 0, [1, BP], 1 |

As shown in row 1 of In the first example, host computer 105 of FIG. 1 has requested data regarding citizens of the United States of America. As may be seen in Table 1, the index for "United States of America" is "3". Thus, the output dictionary may be as shown in Table 2.

Table 4, the first chunk may be processed by rule evaluator 635 is "[1, BP], 3, 3". Since this chunk may include data of interest (the values "3"), rule evaluator 635 may use the map from input dictionary 805 of FIG. 8 to output dictionary 810 of FIG. 8 to replace the value "3" with the value "1". This transcoded chunk may then be moved to previous encode buffer 625 (as shown in row 2 of In the first example, host computer 105 of FIG. 1 has requested data regarding citizens of the United States of America. As may be seen in Table 1, the index for "United States of America" is "3". Thus, the output dictionary may be as shown in Table 2.

Table 4).

In row 2 of In the first example, host computer 105 of FIG. 1 has requested data regarding citizens of the United States of America. As may be seen in Table 1, the index for "United States of America" is "3". Thus, the output dictionary may be as shown in Table 2.

Table 4, the second chunk processed by rule evaluator 635 is "[4, RLE], 2". Since this chunk may not include data of interest (the value "2"), rule evaluator 635 may use the map from input dictionary 805 of FIG. 8 to output dictionary 810 of FIG. 8 to replace the value "2" with the value "0" (indicating that this data is "don't care" data). Since this chunk may contain "don't care" data but previous encode buffer 625 may contain data that is of interest, the data in previous encode buffer 625 may be output to the output stream (as shown in row 3 of In the first example, host computer 105 of FIG. 1 has requested data regarding citizens of the United States of America. As may be seen in Table 1, the index for "United States of America" is "3". Thus, the output dictionary may be as shown in Table 2.

Table 4) and the current transcoded chunk may be moved to previous encode buffer 625 (as shown in row 3 of In the first example, host computer 105 of FIG. 1 has requested data regarding citizens of the United States of America. As may be seen in Table 1, the index for "United States of America" is "3". Thus, the output dictionary may be as shown in Table 2.

Table 4).

In row 3 of In the first example, host computer 105 of FIG. 1 has requested data regarding citizens of the United States of America. As may be seen in Table 1, the index for "United States of America" is "3". Thus, the output dictionary may be as shown in Table 2.

Table 4, the third chunk processed by rule evaluator 635 is "[1, BP], 0, 1". Since this chunk may not include data of interest (the values "0" and "1"), rule evaluator 635 may use the map from input dictionary 805 of FIG. 8 to output dictionary 810 of FIG. 8 to replace the values "0" and "1" with the value "0" (indicating that this data is "don't care" data).

Since this chunk may contain "don't care" data and previous encode buffer 625 already may contain "don't care" data, these two chunks may be combined. Since this chunk uses Bit Packing but the chunk in previous encode buffer 625 uses RLE, one of the two encoding schemes may be replaced with the other encoding scheme. In this example, the Bit Packing-encoded data may be transcoded using RLE. (If two or more values are stored in a single value using Bit Packing, then the entire group may be replicated, which means that the number of replicated values may be a multiple of the number of values packed. RLE, on the other hand, replicates a single value.) As a result, previous encode buffer 625 may now store "[6, RLE] 0" (as shown in row 4 of In the first example, host computer 105 of FIG. 1 has requested data regarding citizens of the United States of America. As may be seen in Table 1, the index for "United States of America" is "3". Thus, the output dictionary may be as shown in Table 2.

Table 4), which combines the four "don't care" values from the second chunk with the two "don't care" values from the third chunk.

In row 4 of In the first example, host computer 105 of FIG. 1 has requested data regarding citizens of the United States of America. As may be seen in Table 1, the index for "United States of America" is "3". Thus, the output dictionary may be as shown in Table 2.

Table 4, the fourth chunk processed by rule evaluator 635 is "[5, RLE], 1". Since this chunk may not include data of interest (the value "1"), rule evaluator 635 may use the map from input dictionary 805 of FIG. 8 to output dictionary 810 of FIG. 8 to replace the value "1" with the value "0" (indicating that this data is "don't care" data).

Since this chunk may contain "don't care" data and previous encode buffer 625 already may contain "don't care" data, these two chunks may be combined. Both chunks use RLE as the encoding scheme to encode the same "don't care" value, so rule evaluator 635 may combine the two chunks by increasing the replication value in the chunk in previous encode buffer 625. As a result, previous encode buffer 625 may now store "[11, RLE] 0" (as shown in row 5 of In the first example, host computer 105 of FIG. 1 has requested data regarding citizens of the United States of America. As may be seen in Table 1, the index for "United States of America" is "3". Thus, the output dictionary may be as shown in Table 2.

Table 4), which combines the four "don't care" values from the second chunk, the two "don't care" values from the third chunk, and the five "don't care" values from the fourth chunk.

In row 5 of In the first example, host computer 105 of FIG. 1 has requested data regarding citizens of the United States of America. As may be seen in Table 1, the index for "United States of America" is "3". Thus, the output dictionary may be as shown in Table 2. Table 4, the second chunk processed by rule evaluator 635 is "[1, BP], 3". Since this chunk may include data of interest (the value "3"), rule evaluator 635 may use the map from input dictionary 805 of FIG. 8 to output dictionary 810 of FIG. 8 to replace the value "3" with the value "1". Note that since this transcoded chunk may contain data of interest whereas previous encode buffer 625 may contain "don't care" data, this transcoded chunk may not be combined with the chunk in previous encode buffer 625.

At this point, normally the transcoded data in previous encode buffer 625 would be output to the output stream and the current transcoded chunk would be moved to previous encode buffer 625. But since the current transcoded chunk is the last chunk in the input stream, both transcoded chunks may be output (the chunk in previous encode buffer 625 output first, of course). Row 6 of In the first example, host computer 105 of FIG. 1 has requested data regarding citizens of the United States of America. As may be seen in Table 1, the index for "United States of America" is "3". Thus, the output dictionary may be as shown in Table 2.

Table 4 shows the final output.

In the second example, host computer 105 of FIG. 1 has requested data regarding citizens of Korea. As may be seen in Table 1, the index for "Korea" is "2". Thus, the output dictionary is as shown in Table 5.

TABLE 5

| ID | Country |
|---|---|
| 0 | Don't Care |
| 1 | Korea |

TABLE 6

| Row | Current Encode Buffer | Previous Encode Buffer | Output Stream |
|---|---|---|---|
| 1 | [1, BP], 3, 3 | | |
| 2 | [4, RLE], 2 | [1, BP], 0, 0 | |
| 3 | [1, BP], 0, 1 | [4, RLE], 1 | [1, BP], 0, 0 |
| 4 | [5, RLE], 1 | [1, BP], 0, 0 | [1, BP], 0, 0, [4, RLE], 1 |
| 5 | [1, BP], 3 | [7, RLE], 0 | [1, BP], 0, 0, [4, RLE], 1 |
| 6 | | | [1, BP], 0, 0, [4, RLE], 1, [8, RLE], 0 |

As shown in row 1 of Table 6, the first chunk processed by rule evaluator 635 is "[1, BP], 3, 3". Since this chunk may include data that is not of interest (the values "3"), rule evaluator 635 may use the map from input dictionary 805 of FIG. 8 to output dictionary 810 of FIG. 8 to replace the value "3" with the value "0" (indicating that this data is "don't care" data). This transcoded chunk may then be moved to previous encode buffer 625 (as shown in row 2 of Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4).

In row 2 of

Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4, the second chunk processed by rule evaluator 635 is "[4, RLE], 2". Since this chunk may include data of interest (the value "2"), rule evaluator 635 may use the map from input dictionary 805 of FIG. 8 to output dictionary 810 of FIG. 8 to replace the value "2" with the value "1". Since this chunk may contain data of interest but previous encode buffer 625 may contain data that is not of interest, the data in previous encode buffer 625 may be output to the output stream (as shown in row 3 of Table 6 In the first example, host computer 105 of FIG. 1 has requested data regarding citizens of the United States of America. As may be seen in Table 1, the index for "United States of America" is "3". Thus, the output dictionary may be as shown in Table 2. Table 4) and the current transcoded chunk may be moved to previous encode buffer 625 (as shown in row 3 of Table 6 In the first example, host computer 105 of FIG. 1 has requested data regarding citizens of the United States of America. As may be seen in Table 1, the index for "United States of America" is "3". Thus, the output dictionary may be as shown in Table 2. Table 4).

In row 3 of

Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4, the third chunk processed by rule evaluator 635 is "[1, BP], 0, 1". Since this chunk may not include data of interest (the values "0" and "1"), rule evaluator 635 may use the map from input dictionary 805 of FIG. 8 to output dictionary 810 of FIG. 8 to replace the values "0" and "1" with the value "0" (indicating that this data is "don't care" data). Since this chunk may contain data not of interest but previous encode buffer 625 may contain data that is interest, the data in previous encode buffer 625 may be output to the output stream (as shown in row 4 of Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4) and the current transcoded chunk may be moved to previous encode buffer 625 (as shown in row 4 of Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4).

In row 4 of

Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4, the fourth chunk processed by rule evaluator 635 is "[5, RLE], 1". Since this chunk may not include data of interest (the value "1"), rule evaluator 635 may use the map from input dictionary 805 of FIG. 8 to output dictionary 810 of FIG. 8 to replace the value "1" with the value "0" (indicating that this data is "don't care" data).

Since this chunk may contain "don't care" data and previous encode buffer 625 may contain "don't care" data, these two chunks may be combined. Since this chunk uses RLE but the chunk in previous encode buffer 625 uses Bit Packing, one of the two encoding schemes may be replaced with the other encoding scheme. In this example, the Bit Packing-encoded data may be transcoded using RLE. (Again, RLE may be selected because a single value, rather than a group of values, may be replicated.) As a result, previous encode buffer 625 now stores "[7, RLE] 0" (as shown in row 5 of In the first example, host computer 105 of FIG. 1 has requested data regarding citizens of the United States of America. As may be seen in Table 1, the index for "United States of America" is "3". Thus, the output dictionary may be as shown in Table 2.

Table 4), which combines the two "don't care" values from the third chunk with the five "don't care" values from the fourth chunk.

In row 5 of

Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4, the second chunk processed by rule evaluator 635 is "[1, BP], 3". Since this chunk may not include data of interest (the value "3"), rule evaluator 635 may use the map from input dictionary 805 of FIG. 8 to output dictionary 810 of FIG. 8 to replace the value "3" with the value "0" (the "don't care" value).

Since this chunk may contain "don't care" data and previous encode buffer 625 may contain "don't care" data, these two chunks may be combined. Since this chunk uses Bit Packing but the chunk in previous encode buffer 625 uses RLE, one of the two encoding schemes may be replaced with the other encoding scheme. In this example, the Bit Packing-encoded data may be transcoded using RLE. As a result, previous encode buffer 625 now stores "[8, RLE] 0", which combines the 2 "don't care" values from the third chunk, the five "don't care" values from the fourth chunk, and the one "don't care" value from the fifth chunk.

Finally, since the fifth chunk was the last chunk of the input stream, rule evaluator 635 may output the transcoded data in previous encode buffer 625. Row 6 of Table 6 In the first example, host computer 105 of FIG. 1 has requested data regarding citizens of the United States of America. As may be seen in Table 1, the index for "United States of America" is "3". Thus, the output dictionary may be as shown in Table 2.

Table 4 shows the final output.

Neither of the above examples show a situation where consecutive chunks include data of interest. Embodiments of the inventive concept may handle such situations in different ways. In one embodiment of the inventive concept, any chunk in previous encode buffer 625 may be output to the output stream when current encode buffer 620 contains data of interest (that is, if current encode buffer 620 contains data of interest, no attempt is made to combine the data in current encode buffer 620 with the data in previous encode buffer 625). In another embodiment of the inventive concept, the chunks in current encode buffer 620 and previous encode buffer 625 may be combined. But in such embodiments of the inventive concept, whether such combination is feasible may depend on whether the values of interest are the same. For example, if one chunk includes data about citizens of China and another chunk includes data about citizens of Korea, such chunks may or may not be combined, depending on the embodiment of the inventive concept. On the other hand, if both chunks include data about citizens of Korea, it may be feasible to combine the two chunks.

Rule evaluator 635 may use transcoding rule 630 to determine what data is of interest and what data is not of interest, what data may be output vs. what data may be stored in previous encode buffer 625, and whether a chunk may be transcoded from one encoding scheme to another. The exact rules may vary depending on the encoding schemes that may be used by the data.

As noted above, rule evaluator 635 may also include index mapper 615. In embodiments of the inventive concept where rule evaluator 635 includes index mapper 615, rule evaluator may apply index mapper 615 to the contents of current encode buffer 620 before transcoding rules 630 are applied.

Table 7 illustrates some rules that may be used when the encoding schemes used may be either RLE or Bit Packing. In embodiments of the inventive concept where other encoding schemes may be used, the rules may be varied accordingly: all such variations are considered to be embodiments of the inventive concept. Further, embodiments of the inventive concept may include rules that manage transcoding data between more than two different types of encoding schemes. For example, a hybrid encoding scheme may use three different encoding schemes: transcoding rules 630 of FIG. 6 may then specify how to transcode data when current encode buffer 620 of FIG. 6 and previous encode buffer 625 of FIG. 6 contain data encoded using any pair of different encoding schemes.

In

Table 7, P represents data that may be of interest to host computer 105 of FIG. 1, DC represents data that may not be of interest to host computer 105. (How data may be identified as of interest or not of interest is discussed further with reference to FIG. 11 below.) Where variables (such as x, y, or z) are used, those variables may represent a count of the number of values that are of interest or not of interest to host computer 105 of FIG. 1. For example, the expression "[g, BP] P(x), DC(y), P(z)" (as used in rules 7 and 9) may indicate that the data is encoded using Bit Packing: the group includes x values of interest at the start of the group, y values that are not of interest in the middle of the group, and z values of interest at the end of the group. It may be expected that x, y, z, g, and G meet the constraints that g*G=x+y+z, 1≤g≤63, x mod G=0, y mod G=0, z mod G=0, y≠0, and y≥16 divided by the number of bits per packed value. Finally, PEB (in the output column) may indicate that whatever was stored in previous encode buffer 625 when the rule is selected for application may be output to the output stream.

Table 7 also considers a situation in which any data has already been subject to mapping by index mapper 615, and therefore contains values corresponding to output dictionary 810 of FIG. 8.

TABLE 7

| Rule | Current Encode Buffer | Previous Encode Buffer | New Previous Encode Buffer | New Previous Current Buffer | Output |
|---|---|---|---|---|---|
| 1 | [r, RLE] | P | Anything | [r, RLE], P | Next chunk | PEB |
| 2 | [r, RLE] DC | [$r_1$, RLE] DC | [$r_1$ + r, RLE] DC | Next chunk | |
| 3 | [r, RLE] DC | Anything else | [r, RLE] DC | Next chunk | PEB |
| 4 | [g, BP], P | Anything | [g, BP], P | Next chunk | PEB |
| 5 | [g, BP] DC(y) | [$r_1$, RLE] DC | [$r_1$ + y, RLE] DC | Next chunk | |
| 6 | [g, BP] DC(y), P(z) | [$r_1$, RLE] DC | [$r_1$ + y, RLE] DC | [z / 8, BP] PO(z) | |
| 7 | [g, BP] P(x), DC(y), P(z) | [$r_1$, RLE] DC | [x/8, BP] P(x) | [(y + z)/8, BP] DC(y), P(z) | PEB |
| 8 | [g, BP] DC(y), P(z) | Anything else | [y, RLE] DC | [z/8, BP] P(z) | PEB |
| 9 | [g, BP] P(x), DC(y), P(z) | Anything else | [x/8, BP] P(x) | [(y+ z)/8, BP] DC(y), P(z) | PEB |

The above discussion describes how transcoding may be performed on data in general. But when data is stored in a columnar format, the columnar format may be leveraged to benefit transcoding. Before this leverage may be described, an understanding of columnar format is useful. For purposes of illustration, columnar format is described with reference to SSDs, but embodiments of the inventive concept may include other storage devices that may utilize columnar formats.

Figure 9:
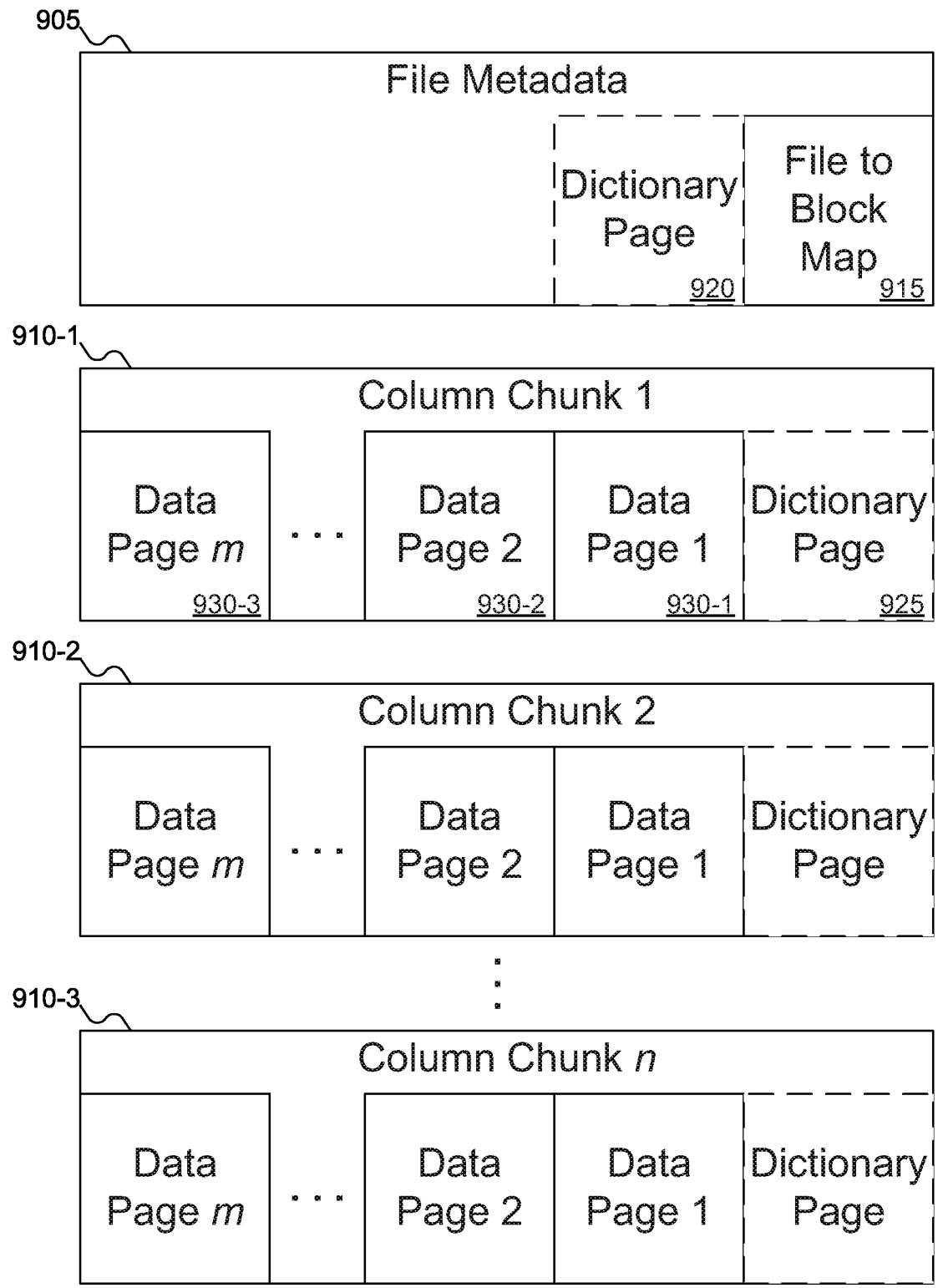
FIG. 9 shows an example file stored in a columnar format.

FIG. 9 shows an example file stored in a columnar format. In FIG. 9, a file is shown. The file may include file metadata 905 and column chunks 910-1, 910-2, and 910-3. While FIG. 9 shows three column chunks 910-1 through 910-3, embodiments of the inventive concept may include any number (zero or more) of chunks without limitation.

File metadata 905 may include metadata pertinent to the file. While other metadata may also be stored, FIG. 9 shows file metadata 905 as including file to block map 915 and dictionary page 920. Dictionary page 920 may be a dictionary used to encode values within the data of the file, such as the dictionary shown above in Table 1. Dictionary page 920 may also store multiple dictionaries that may be used to encode different data within the file: for example, one dictionary might store country names, whereas another dictionary might store surnames.

File to block map 915 may identify the blocks storing individual column chunks 910-1, 910-2, and 910-3, as well as their relative order. File to block map 915 may also specify the order of data pages within each column chunk 910-1, 910-2, and 910-3, or the page order may be specified within column chunks 910-1, 910-2, and 910-3. File to block map 915 may be similar to file to block map 530 of FIG. 5, except that where file to block map 530 may provide information about which blocks are used to store every file stored on storage device 120 of FIG. 1, file to block map 915 may provide information about which blocks are used to store the file shown in FIG. 9. (Of course, both file to block maps may be used together: file to block map 530 of FIG. 5 may be used to locate the block storing file metadata 905 for each file, and then file to block map 915 in file metadata 905 may be used to locate the column chunks storing the column chunks for the file.)

In general, a single column chunk may span multiple blocks, and a single block may store multiple column chunks. As long as there is some way to identify where data is stored and what that data represents (for example, what file includes that data), there is little difficulty in more general solutions to data storage. But for purposes of this discussion, considers a situation in which a column chunk may fit in a single block and that blocks do not share column chunks. Thus, each of column chunks 910-1, 910-2, and 910-3 may be stored in a separate block.

Within column chunk 910-1 (column chunks 910-2 and 910-3 are similar) may be dictionary page 925 and data pages 930-1, 930-2, and 930-3. Although FIG. 9 shows three data pages, embodiments of the inventive concept may include any number (zero or more) of data pages in a column chunk. The data pages may store the actual data of the file, divided into units that may fit into individual pages.

Dictionary page 925 may store a dictionary used for data within column chunk 910-1. As with dictionary page 920, dictionary page 925 may store multiple dictionaries that may be used to encode different data within the file.

A question might arise as to why FIG. 9 shows both dictionary page 920 and dictionary page 925. The reason is that dictionary pages 920 and 925 might be used in different implementations of a columnar format. For example, one columnar storage format may use a single dictionary for the entire file, which may be stored in dictionary page 920. But another columnar format may use individual dictionary pages 925 in each column chunk 910-1, 910-2, and 910-3. The advantage of using dictionary page 925 is that if a particular column chunk does not use a dictionary, or certain values are not used in the data within the particular column chunk, such information may be omitted from dictionary page 925, reducing the size of dictionary page 925 (or even eliminating it entirely). But on the other hand, multiple dictionary pages 925 in different column chunks may result in data replication: the same dictionary entries might be used in multiple column chunks. This is why dictionary pages 920 and 925 are shown with dashed lines: either may be omitted, depending on the columnar storage format being used. (In fact, it could even happen that the file does not use a dictionary at all, in which case dictionary pages 920 and 925 might both be omitted.)

Figure 10:
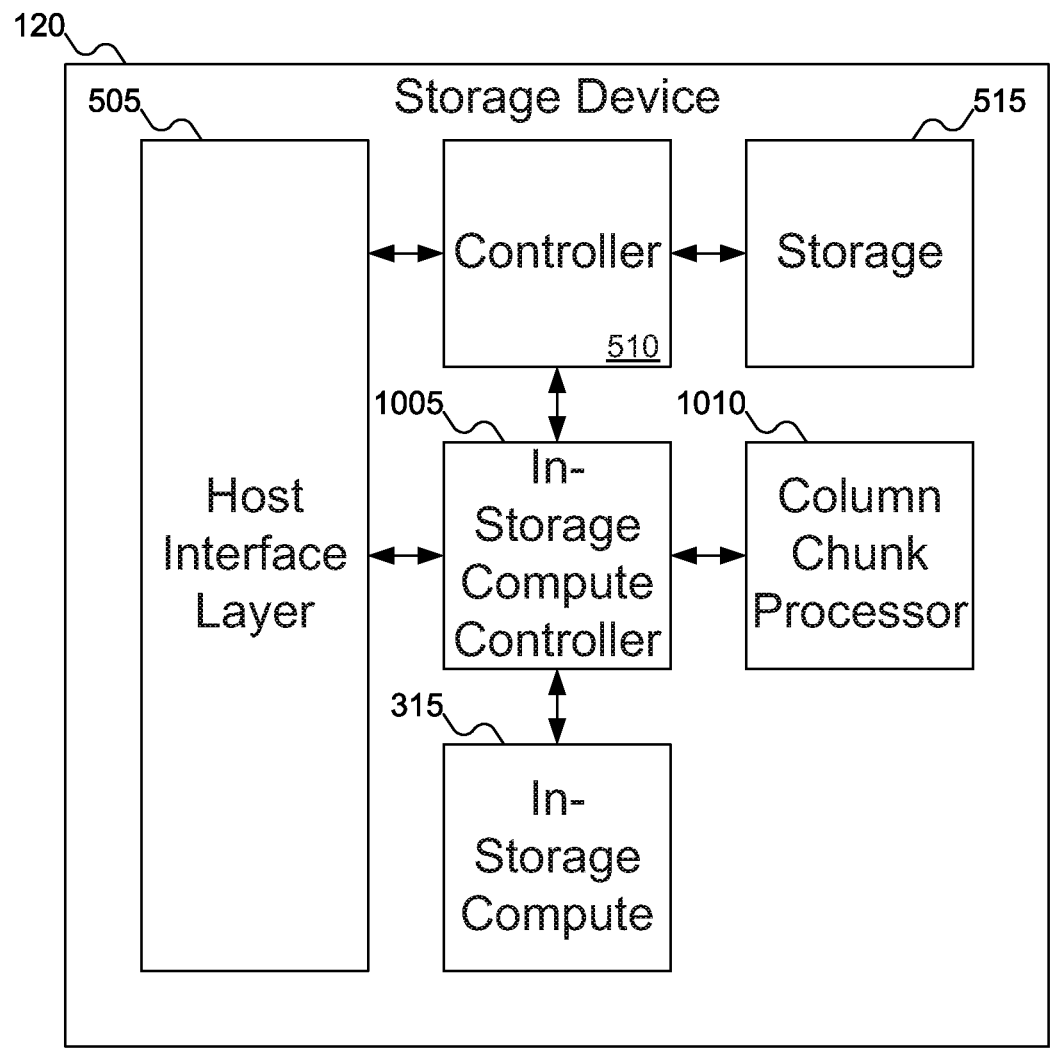
FIG. 10 shows the storage device of FIG. 1 configured to implement transcoding where data is stored in a columnar format, according to an embodiment of the inventive concept.

Now that columnar format has been described, the adaptations to use transcoder 420 of FIG. 4 in a storage device using columnar format may be described. FIG. 10 shows storage device 120 of FIG. 1 configured to implement transcoding where data is stored in a columnar format. In FIG. 10, storage device 120 may include host interface layer 505, storage device controller 510, and storage 515, which function similarly to their description with reference to FIG. 5 above (again, storage device 120 may be an SSD, a hard disk drive, or any other storage device that may use columnar format).

Storage device 120 may also include in-storage compute controller 1005, column chunk processor 1010, and in-storage compute 305. In-storage compute controller 1005 may manage what information is sent to in-storage compute 305 and column chunk processor 1010. For example, when host computer 105 of FIG. 1 requests that storage device 120 perform some acceleration function—such as counting the number of citizens of a particular country—in-storage compute controller 1005 may provide the predicate (identifying the country of interest) to column chunk processor 1010. In-storage compute controller 1005 may also access data—specifically, column chunks—from storage 515 and provide that data to column chunk processor 1010. In-storage compute controller 1005 may also determine the encoding scheme used in the data (assuming that a single encoding scheme is used for a column chunk or the entire file, and not a hybrid encoding scheme) and provide the encoding type to column chunk processor 1010. Finally, in-storage compute controller 1005 may transcoded data back from column chunk processor and may return that transcoded data to host computer 105 of FIG. 1 (via host interface layer 505) or to in-storage compute 305, as appropriate to the request from host computer 105 of FIG. 1. The structure and operation of column chunk processor 1010 is discussed with reference to FIG. 11 below.

In-storage compute controller 1005 and column chunk processor 1010 may be implemented using a suitably programmed general purpose processor, an FPGA, an ASIC, a GPU, or a GPGPU, among other possibilities. In-storage compute controller 1005 and column chunk processor 1010 may be implemented using the same hardware or different hardware (for example, in-storage compute controller 1005 may be implemented as an ASIC, whereas column chunk processor 1010 may be implemented as an FPGA), and they may be implemented as a single unit or as separate components.

Figure 11:
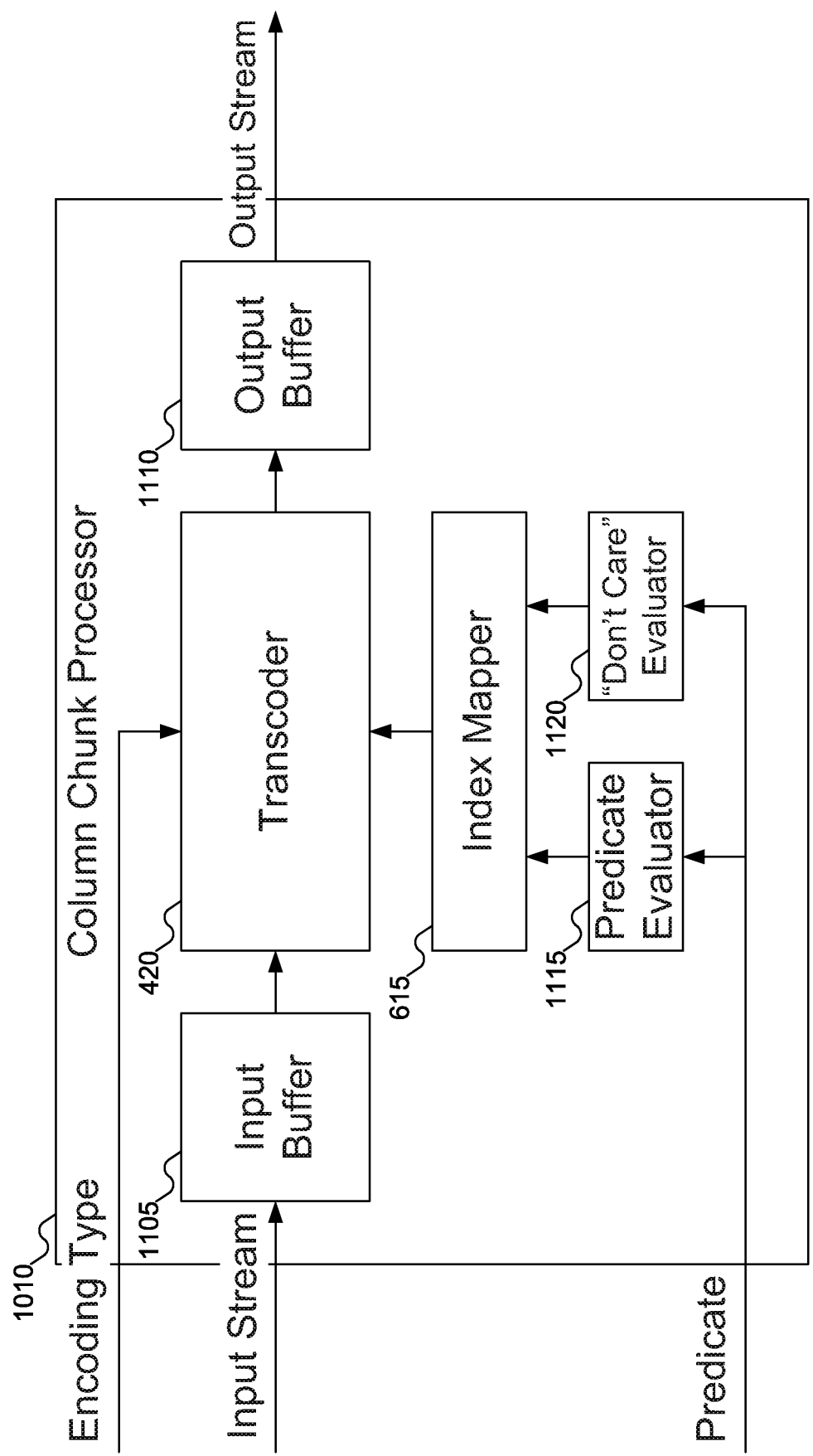
FIG. 11 shows the column chunk processor of FIG. 10 configured to implement transcoding where data is stored in a columnar format, according to an embodiment of the inventive concept.

FIG. 11 shows column chunk processor 1010 of FIG. 10 configured to implement transcoding where data is stored in a columnar format. In FIG. 11, column chunk processor 1010 may receive as inputs an input stream, an encoding type, and a predicate, and may produce as output an output stream. The input stream may be stored in input buffer 1105. The input stream may be a single data page from a column chunk, or it may be all the data in the column chunk. The data from input buffer 1105 may then be provided to transcoder 420 as an input stream (as described above with reference to FIG. 6): transcoder 420 may also receive the encoding type from in-storage compute controller 1005 of FIG. 10, as discussed with reference to FIG. 10. Note that as transcoder 420 may include circular buffer 605 of FIG. 6, input buffer 1105 may be omitted: the data may be stored in circular buffer 605 of FIG. 6 on which stream splitter 610 of FIG. 6 may operate. But in some embodiments of the inventive concept circular buffer 605 of FIG. 6 may not be large enough to store an entire data page or column chunk (or the input stream may be providing the data faster than data may be removed from circular buffer 605 of FIG. 6), in which case input buffer 1105 may act as a temporary repository for data that may not fit immediately into circular buffer 605 of FIG. 6.

The output of transcoder 420—the output stream described with reference to FIG. 6 above—may be stored in output buffer 1110. Again, while data may be sent directly to its destination as produced by transcoder 420, it may be useful to send data in specific units, such as a complete data page or column chunk. In such situations, output buffer 1110 may store the output stream until the appropriate unit of data has been produced. At that point, column chunk processor 1010 may send the output stream to in-storage compute controller 1005 of FIG. 10 or to host computer 105 of FIG. 1, as appropriate to the requested transcoding operation.

Index mapper 615 (shown outside transcoder 420 in FIG. 11, although index mapper 615 may be part of transcoder 420 as shown in FIG. 6), may receive information from predicate evaluator 1115 and "don't care" evaluator 1120. Predicate evaluator 1115 may receive the predicate from in-storage compute controller 1005 of FIG. 10 and use the predicate to determine what data is of interest. Comparison operators may be used by predicate evaluator 1115 to identify which values in input dictionary 805 of FIG. 8 (which might be either of dictionary pages 920 and 925 of FIG. 9) are of interest to host computer 105 of FIG. 1. "Don't care" evaluator 1120 may operate similarly (but in mirror form) to identify what data is not of interest. Note that since predicate evaluator 1115 and "don't care" evaluator 1120 are complimentary in operation, it may be possible to use one of the two evaluators (with any data not meeting the criteria for one evaluator consequently fitting the criteria for the other evaluator): thus, one of predicate evaluator 1115 and "don't care" evaluator 1120 may be omitted. This information may be provided by predicate evaluator 1115 and "don't care" evaluator 1120 to index mapper 615, enabling index mapper 615 to establish the mapping from input dictionary 805 of FIG. 8 to output dictionary 810 of FIG. 8.

As an example, consider again a query from host computer 105 of FIG. 6 to count the number of entries in a data set that include citizens of the United States of America. When this query arrives, the predicate may be extracted (for example, "citizenship=United States of America": the exact format of the predicate may depend on the format of the data set and the application used to submit the query). Examination of input dictionary 805 of FIG. 8 (such as that shown in Table 1) may be used to replace "United States of America" with the value "3". Thus, the predicate provided to index mapper 615 may specify "citizenship=3", after which index mapper 615 may generate output dictionary 810 of FIG. 8 (such as that shown in Table 2) and the map shown in Table 3.

Note that the results of predicate evaluator 1115 may also be provided to transcoder 420 for use in constructing transcoding rules 630 of FIG. 6. Since transcoding rules 630 of FIG. 6 may depend on knowing what data is of interest to host computer 105 of FIG. 1, transcoding rules 630 of FIG. 6 may be adapted to use the results of predicate evaluator 1115. For example, consider again the rules shown in Table 7. The results of predicate evaluator 1115 (or even the map from input dictionary 805 of FIG. 8 to output dictionary 810 of FIG. 8 (such as that shown in Table 3)) may be used to establish the appropriate values for P and DC in the various rules.

Note also that in FIG. 11 the predicate applies to whatever data is input to transcoder 420 as the input stream. While it is reasonable to conclude that the predicate will be applied to the entirety of the data set to which host computer 105 of FIG. 1 submits the query, transcoder 420 views the input stream as complete, even if the input stream might represent a portion of the data set. For example, column chunk processor 1010 may process each data page 930-1, 930-2, and 930-3 of FIG. 9 as its own "input stream" using transcoder 420. Since transcoder 420 is agnostic about what the input stream represents, this process works without problem.

Figure 12A:
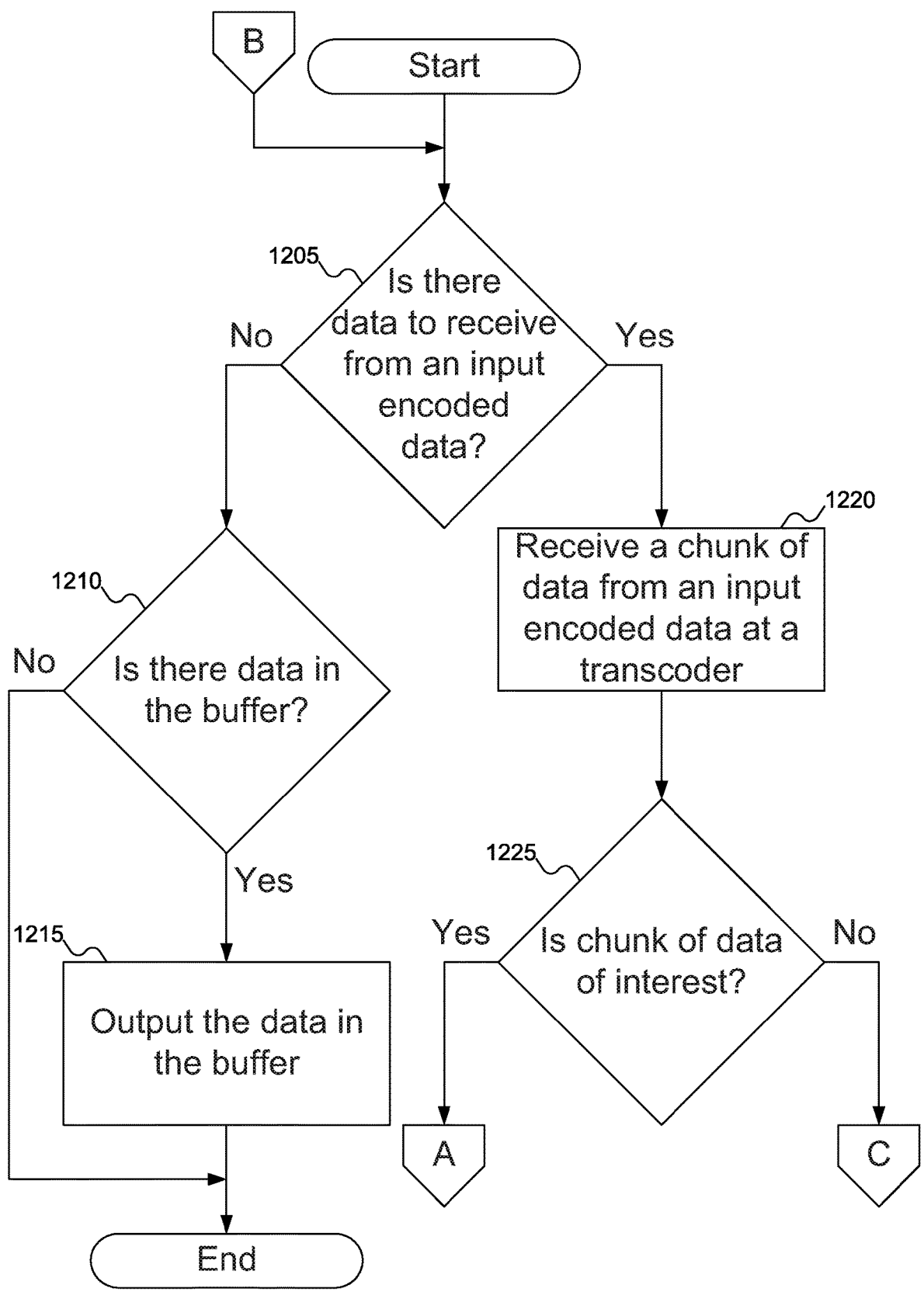
Figure 12B:
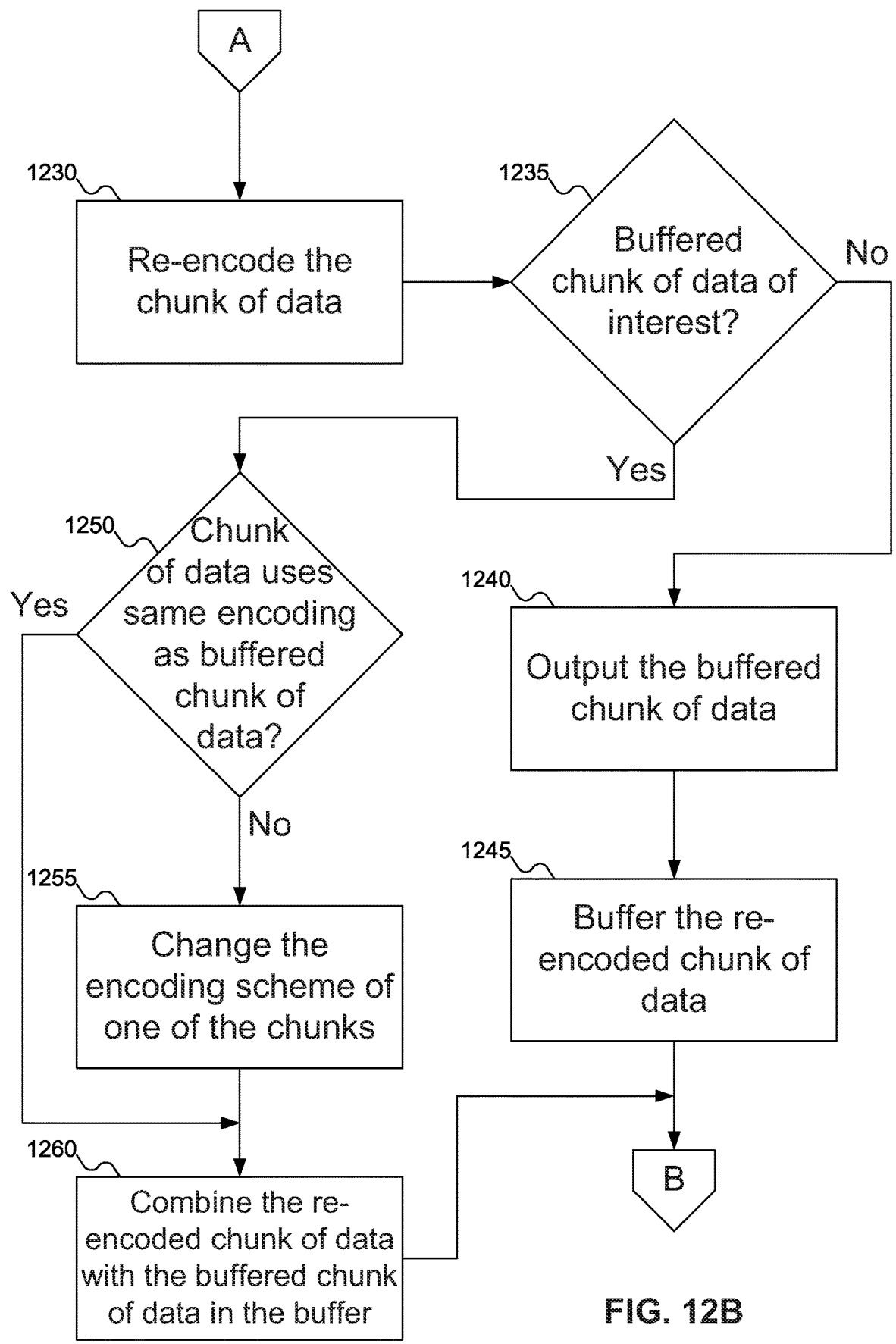

FIGS. 12A-12C show a flowchart of an example procedure for transcoder 420 of FIGS. 4 and 6 to transcode data, according to an embodiment of the inventive concept. In FIG. 12A, at block 1205, transcoder 420 of FIG. 6 may check to see if there any data still to be received from an input stream. In general, this input stream may come from any source, but as discussed above with reference to FIGS. 9-11, this input stream may be pages of data from column chunks when the data is stored in columnar format. If there is no remaining data to receive from the input stream, then at block 1210 transcoder 420 of FIG. 6 may check to see if there is any transcoded data remaining in either previous encode buffer 625 of FIG. 6 or current encode buffer 620 of FIG. 6. If there is any transcoded data remaining in either previous encode buffer 625 of FIG. 6 or current encode buffer 620 of FIG. 6, then the transcoded data in previous encode buffer 625 of FIG. 6 is output to the output stream, followed by the transcoded data in current encode buffer 625 of FIG. 6. In most situations there should be nothing in current encode buffer 620 of FIG. 6, as rule evaluator 635 may operate on the data in current encode buffer 620 of FIG. 6. Even in situations where data may be left in current encode buffer 620 of FIG. 6 as a result of applying transcoding rules 630 of FIG. 6 (for example, as shown in rules 6-9 of
Table 7), rule evaluator 635 of FIG. 6 would then operate on that data before transcoder 420 of FIG. 6 would look for new data from the input stream (via circular buffer 605 of FIG. 6 and stream splitter 610 of FIG. 6): transcoder 420 of FIG. 6 may wait for current encode buffer 620 of FIG. 6 to be clear before attempting to process the next chunk of data from the input stream. But in the event that transcoded data remains in current encode buffer 620 of FIG. 6, that transcoded data may be output to the output stream. Once all data has been output to the output stream at block 1215, processing may end (until transcoder 420 of FIG. 6 is expected to process a new input stream).

Assuming that there is still data to process from the input stream, then at block 1220 circular buffer 605 of FIG. 6 may receive the next encoded data from the input stream, after which stream splitter 610 of FIG. 6 may identify the first chunk in the encoded data and forward that chunk to index mapper 615 of FIG. 6. (In embodiments of the inventive concept where index mapper 615 of FIG. 6 is effectively part of rule evaluator 635 of FIG. 6, stream splitter 610 of FIG. 6 may place the chunk of encoded data in current encode buffer 620 of FIG. 6.) At block 1225, index mapper 615 of FIG. 6 (or rule evaluator 635 of FIG. 6) may determine if the chunk of data is of interest: more particularly, whether the chunk of data includes data requested by host computer 105 of FIG. 1 (for example, from a predicate).

If the chunk of encoded data includes data of interest to host computer 105 of FIG. 1, then at block 1230 (FIG. 12B), index mapper 615 of FIG. 6 (or rule evaluator 635 of FIG. 6) may use the map from input dictionary 805 of FIG. 8 to output dictionary 810 of FIG. 8 to re-encode any data in the chunk. At block 1235, rule evaluator 635 of FIG. 6 may check to see if any transcoded data in previous encode buffer 625 of FIG. 6 is of interest to host computer 105 of FIG. 1. If not (and recalling that the current chunk is of interest to host computer 105 of FIG. 1, as determined at block 1225 of FIG. 12A), then at block 1240 transcoder 420 of FIG. 6 may output the transcoded data in previous encode buffer 625 of FIG. 6 to the output stream, and at block 1245 transcoder 420 of FIG. 6 may store the current transcoded chunk in previous encode buffer 625 of FIG. 6, after which processing may return to block 1205 of FIG. 12A.

On the other hand, if previous encode buffer 625 of FIG. 6 also stores data of interest to host computer 105 of FIG. 1 as determined at block 1235, then at block 1250 rule evaluator 635 of FIG. 6 may determine whether the current chunk and the transcoded chunk in previous encode buffer 625 of FIG. 6 use the same encoding scheme. If not, then at block 1255 rule evaluator 635 of FIG. 6 may change the encoding scheme used by one of the chunks (either the chunk in current encode buffer 620 of FIG. 6 or the chunk in previous encode buffer 625 of FIG. 6). (In situations where more than two encoding schemes are used, rule evaluator 635 of FIG. 6 might change the encoding scheme used by both chunks in current encode buffer 620 of FIG. 6 and previous encode buffer 625 of FIG. 6.) Then, with the chunks in both current encode buffer 620 of FIG. 6 and previous encode buffer 625 of FIG. 6 known to use the same encoding scheme, at block 1260 rule evaluator 635 of FIG. 6 may combine the two chunks into a single chunk, which may be stored in previous encode buffer 625 of FIG. 6, after which processing may return to block 1205 of FIG. 12A.

Note that FIG. 12B shows that the current chunk may be transcoded twice: once in block 1230 (when values are updated to correspond to output dictionary 810 of FIG. 8) and once in block 1255 (when changed from one encoding scheme to another, if the encoding scheme of the current chunk is being changed). While it is possible to perform these two operations separately, it is also possible to combine the two operations: that is, to simultaneously change the encoding scheme and update the values. Embodiments of the inventive concept include performing these operations both separately and as a single step.

Recall that FIG. 12B describes the operations performed when the current chunk is of interest to host computer 105 of FIG. 1 (as determined at block 1225 of FIG. 12A). In the event that the current chunk is not of interest to host computer 105 of FIG. 1 (again, as determined at block 1225 of FIG. 12A), then at block 1265 (FIG. 12C) index mapper 615 of FIG. 6 (or rule evaluator 635 of FIG. 6) may use the map from input dictionary 805 of FIG. 8 to output dictionary 810 of FIG. 8 to re-encode any data in the chunk (specifically, to a "don't care" value). At block 1270, rule evaluator 635 of FIG. 6 may check to see if any transcoded data in previous encode buffer 625 of FIG. 6 is of interest to host computer 105 of FIG. 1. If so (and recalling that the current chunk is not of interest to host computer 105 of FIG. 1, as determined at block 1225 of FIG. 12A), then at block 1275 transcoder 420 of FIG. 6 may output the transcoded data in previous encode buffer 625 of FIG. 6 to the output stream, and at block 1280 transcoder 420 of FIG. 6 may store the current transcoded chunk in previous encode buffer 625 of FIG. 6, after which processing may return to block 1205 of FIG. 12A.

On the other hand, if previous encode buffer 625 of FIG. 6 also stores data that is not of interest to host computer 105 of FIG. 1 as determined at block 1270, then at block 1285 rule evaluator 635 of FIG. 6 may determine whether the current chunk and the transcoded chunk in previous encode buffer 625 of FIG. 6 use the same encoding scheme. If not, then at block 1290 rule evaluator 635 of FIG. 6 may change the encoding scheme used by one of the chunks (either the chunk in current encode buffer 620 of FIG. 6 or the chunk in previous encode buffer 625 of FIG. 6). (In situations where more than two encoding schemes are used, rule evaluator 635 of FIG. 6 might change the encoding scheme used by both chunks in current encode buffer 620 of FIG. 6 and previous encode buffer 625 of FIG. 6.) Then, with the chunks in both current encode buffer 620 of FIG. 6 and previous encode buffer 625 of FIG. 6 known to use the same encoding scheme, at block 1295 rule evaluator 635 of FIG. 6 may combine the two chunks into a single chunk, which may be stored in previous encode buffer 625 of FIG. 6, after which processing may return to block 1205 of FIG. 12A.

Note that FIG. 12C shows that the current chunk may be transcoded twice: once in block 1265 (when values are updated to correspond to output dictionary 810 of FIG. 8) and once in block 1290 (when changed from one encoding scheme to another, if the encoding scheme of the current chunk is being changed). While it is possible to perform these two operations separately, it is also possible to combine the two operations: that is, to simultaneously change the encoding scheme and update the values. Embodiments of the inventive concept include performing these operations both separately and as a single step.

Throughout FIGS. 12A-12C, there is an implicit assumption that there is some data in previous encode buffer 625 of FIG. 6. For example, blocks 1235 and 1270 describe a situation in which there is some data in previous encode buffer 625 of FIG. 6. This is generally a reasonable assumption, since transcoded data may be buffered in previous encode buffer 625 of FIG. 6 to support combining chunks of data that may be combined (if the data were already output to the output stream, it would be too late to attempt to combine the chunks). However there may be situations in which there is no data stored in previous encode buffer 625 of FIG. 6. As one example, when the very first chunk of the input stream is processed, there is no data in previous encode buffer 625 (since nothing has been previously processed in that input stream). As a second example, there might be an encoding scheme that does not support combining chunks of data, in which case there is little value in storing a previous chunk in previous encode buffer 625 of FIG. 6. If there is no data in previous encode buffer 625 of FIG. 6, then there is no point in performing a comparison of the current chunk with a (non-existent) chunk in previous encode buffer 625 of FIG. 6, or to output a (non-existent) chunk from previous encode buffer 625 of FIG. 6. The simple solution is that if there is no data in previous encode buffer 625 of FIG. 6, then nothing that would depend on the presence of data in previous encode buffer 625 may be done. Thus, for example, in FIG. 12B, if there is no data in previous encode buffer 625, processing may jump directly from block 1230 to block 1245 (to buffer the current transcoded chunk in previous encode buffer 625 of FIG. 6), and in FIG. 12C processing may jump directly from block 1265 to block 1280 (to buffer the current transcoded chunk in previous encode buffer 625 of FIG. 6).

A careful examination of FIGS. 12B and 12C will show that there is relatively little difference between the two. Some differences of note are in blocks 1230 and 1265, and the different branches leaving from blocks 1235 and 1270. In fact, even these differences are of relatively minor significance: blocks 1230 and 1265 are both about re-encoding based on output dictionary 810 of FIG. 8 (block 1265 just specifically names the use of the "don't care" value). And while the branches leaving blocks 1235 and 1270 are labeled differently, the reason is because blocks 1235 and 1270 are both about determining whether the current chunk may be combined with the previous chunk. Thus, FIGS. 12B-12C could theoretically be combined, albeit at the expense of some loss of clarity regarding the sequence of operations.

Figure 13:
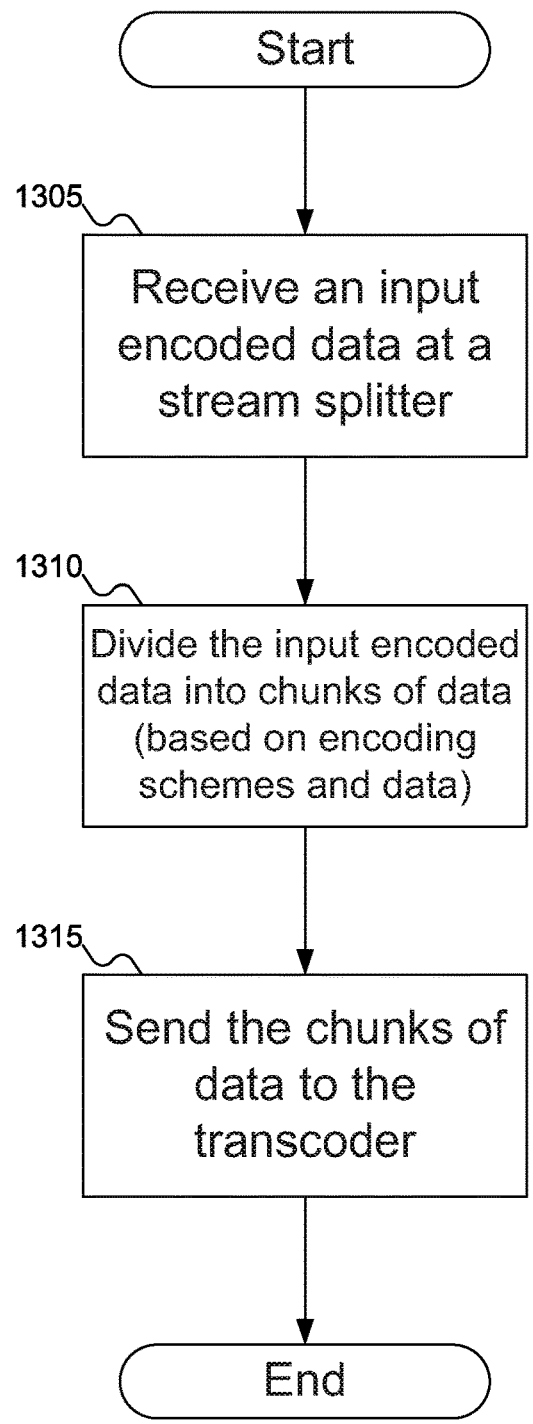
FIG. 13 shows a flowchart of an example procedure for the stream splitter of FIG. 6 to divide an input encoded data into chunks.

FIG. 13 shows a flowchart of an example procedure for stream splitter 610 of FIG. 6 to divide an input encoded data into chunks. In FIG. 13, at block 1305, stream splitter 610 of FIG. 6 may receive an input encoded data (which may originate from storage 305 of FIG. 3 within storage device 120 of FIG. 1), which may be buffered in a buffer, such as input buffer 1105 of FIG. 11 or circular buffer 605 of FIG. 6. At block 1310, stream splitter 610 of FIG. 6 may divide the input encoded data into chunks. At block 1315, stream splitter 610 of FIG. 6 may send the chunks to transcoder 420 of FIG. 6 (or to index mapper 615 of FIG. 6 or current encode buffer 620 of FIG. 6).

Figure 14A:
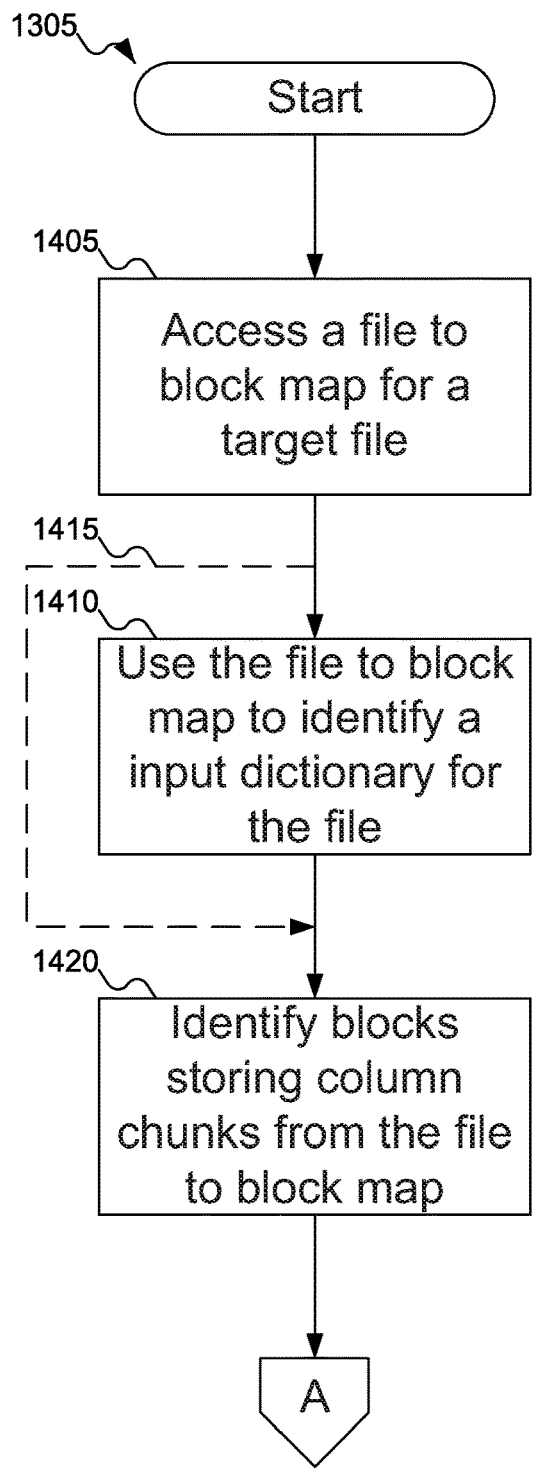
FIGS. 14A-14B show a flowchart of an example procedure for the column chunk processor of FIG. 10 and/or the transcoder of FIG. 4 to transcode data stored in a columnar format, according to an embodiment of the inventive concept.
Figure 14B:
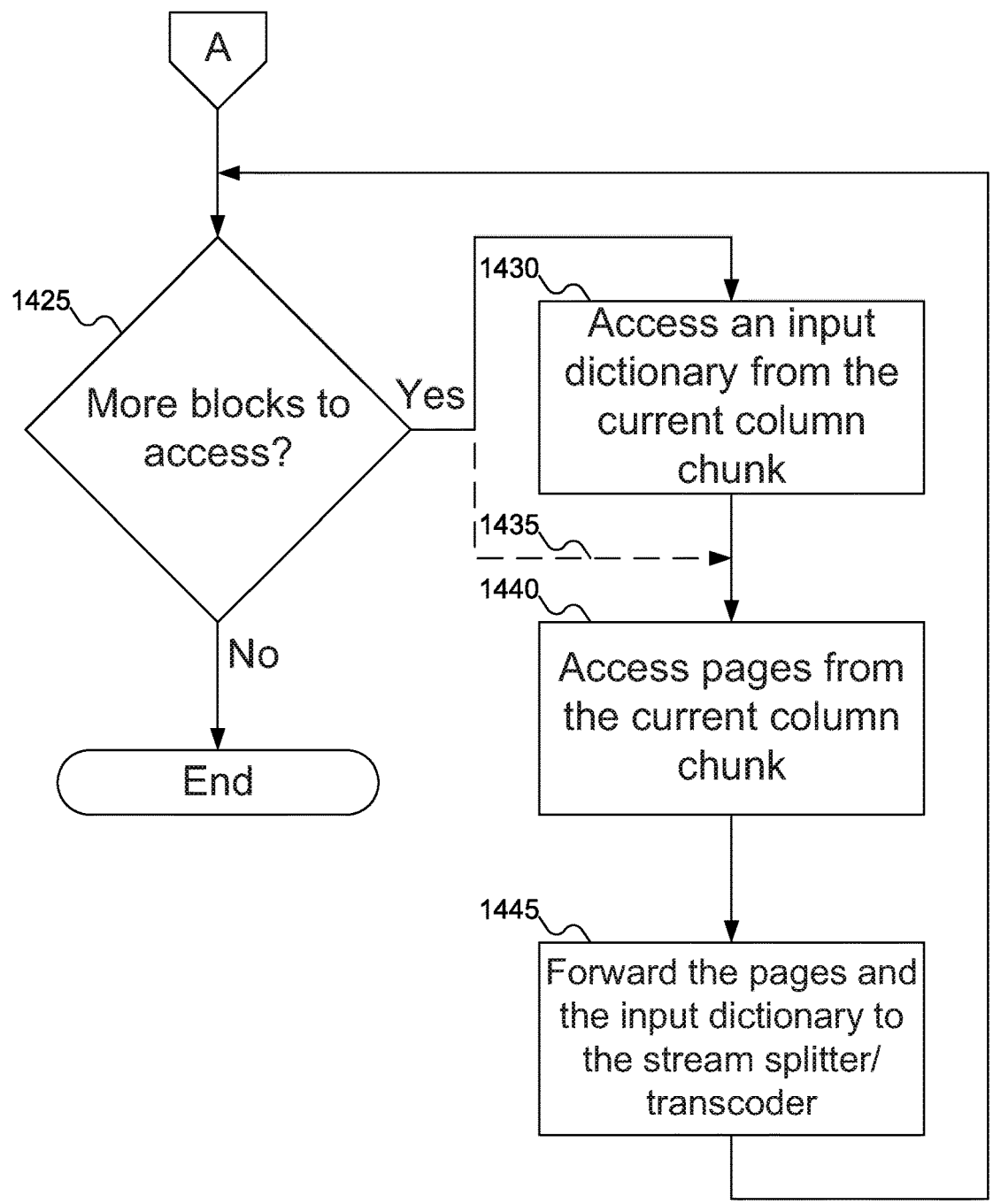

FIGS. 14A-14B show a flowchart of an example procedure for column chunk processor 1010 of FIG. 10 and/or transcoder 420 of FIGS. 4 and 6 to transcode data stored in a columnar format, according to an embodiment of the inventive concept. FIGS. 14A-14B may also be viewed as expanding, in at least one embodiment, on how stream splitter 610 of FIG. 6 may receive input encoded data as described in block 1305 of FIG. 13.

In FIG. 14A, at block 1405, column chunk processor 1010 of FIG. 10 may access file to block map 915 of FIG. 9 (or alternatively or cumulatively file to block map 530 of FIG. 5) for a file. At block 1410, column chunk processor 1010 of FIG. 10 may use file to block map 915 of FIG. 9 to locate file metadata 905 of FIG. 9 and thence input dictionary 920 of FIG. 9. If each column chunk 910-1, 910-2, and 910-3 of FIG. 9 includes its own dictionary page 925 of FIG. 9, then dictionary page 920 of FIG. 9 may be omitted from file metadata 905 of FIG. 9, in which case block 1410 may be omitted, as shown by dashed line 1415. Then, using file to block map 915 of FIG. 9, at block 1420 column chunk processor 1010 of FIG. 10 may identify column chunks for the file (which may be blocks of data stored on storage device 120 of FIG. 1).

At block 1425 (FIG. 14B), column chunk processor 1010 of FIG. 10 may determine if there are more column chunks (blocks) to access. If not, then processing completes. Otherwise, at block 1430, column chunk processor 1010 of FIG. 10 may access dictionary page 925 of FIG. 9 from column chunks 910-1, 910-2, or 910-3 of FIG. 9. If file metadata 905 of FIG. 9 stores dictionary page 920 of FIG. 9, then column chunks 910-1, 910-2, and 910-3 of FIG. 9 may omit dictionary page 925 of FIG. 9, in which case block 1430 may be omitted, as shown by dashed line 1435. At block 1440, column chunk processor 1010 of FIG. 10 may access data pages 930-1, 930-2, and 930-3 of FIG. 9 from column chunks 910-1, 910-2, and 910-3 of FIG. 9. At block 1445, column chunk processor 1010 of FIG. 10 may forward input dictionary 805 of FIG. 8 and data pages 930-1, 930-2, and 930-3 of FIG. 9 for the column chunk (in order) to transcoder 420 of FIG. 6, stream splitter 610 of FIG. 6, or index mapper 615 of FIG. 6.

Figure 15:
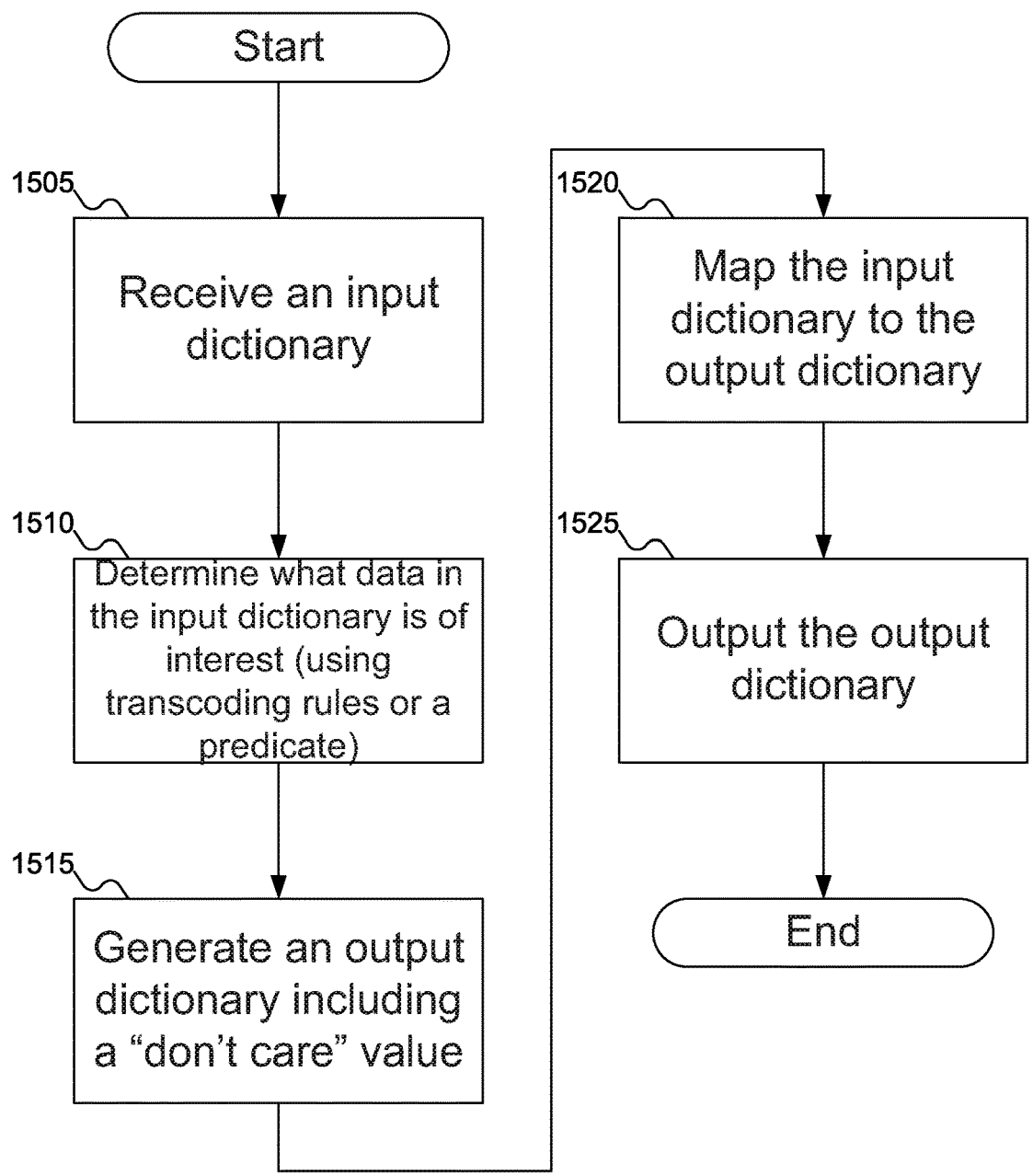
FIG. 15 shows a flowchart of an example procedure for the index mapper of FIG. 6 to map an input dictionary to an output dictionary, according to an embodiment of the inventive concept.

FIG. 15 shows a flowchart of an example procedure for index mapper 615 of FIG. 6 to map input dictionary 805 of FIG. 8 to output dictionary 810 of FIG. 8, according to an embodiment of the inventive concept. In FIG. 15, at block 1505, index mapper 615 of FIG. 6 may receive input dictionary 805 of FIG. 8 (for example, from column chunk processor 1010 of FIG. 10). At block 1510, index mapper 615 of FIG. 6 may determine what data in input dictionary 805 of FIG. 8 is of interest. Index mapper 615 of FIG. 6 make this determination using, for example, the predicate received host computer 105 of FIG. 1, perhaps via in-storage compute controller 1005 of FIG. 10. At block 1515, index mapper 615 of FIG. 6 may generate output dictionary 810 of FIG. 8. Output dictionary 810 may include all the entries of interest to host computer 105 of FIG. 1, but may coalesce all the entries not of interest to host computer 105 of FIG. 1 into a single "don't care" value. At block 1520, index mapper 615 of FIG. 6 may map values from input dictionary 805 of FIG. 8 to output dictionary 810 of FIG. 8. Finally, at block 1525, index mapper 615 of FIG. 6 may output output dictionary 810 of FIG. 8.

Figure 16A:
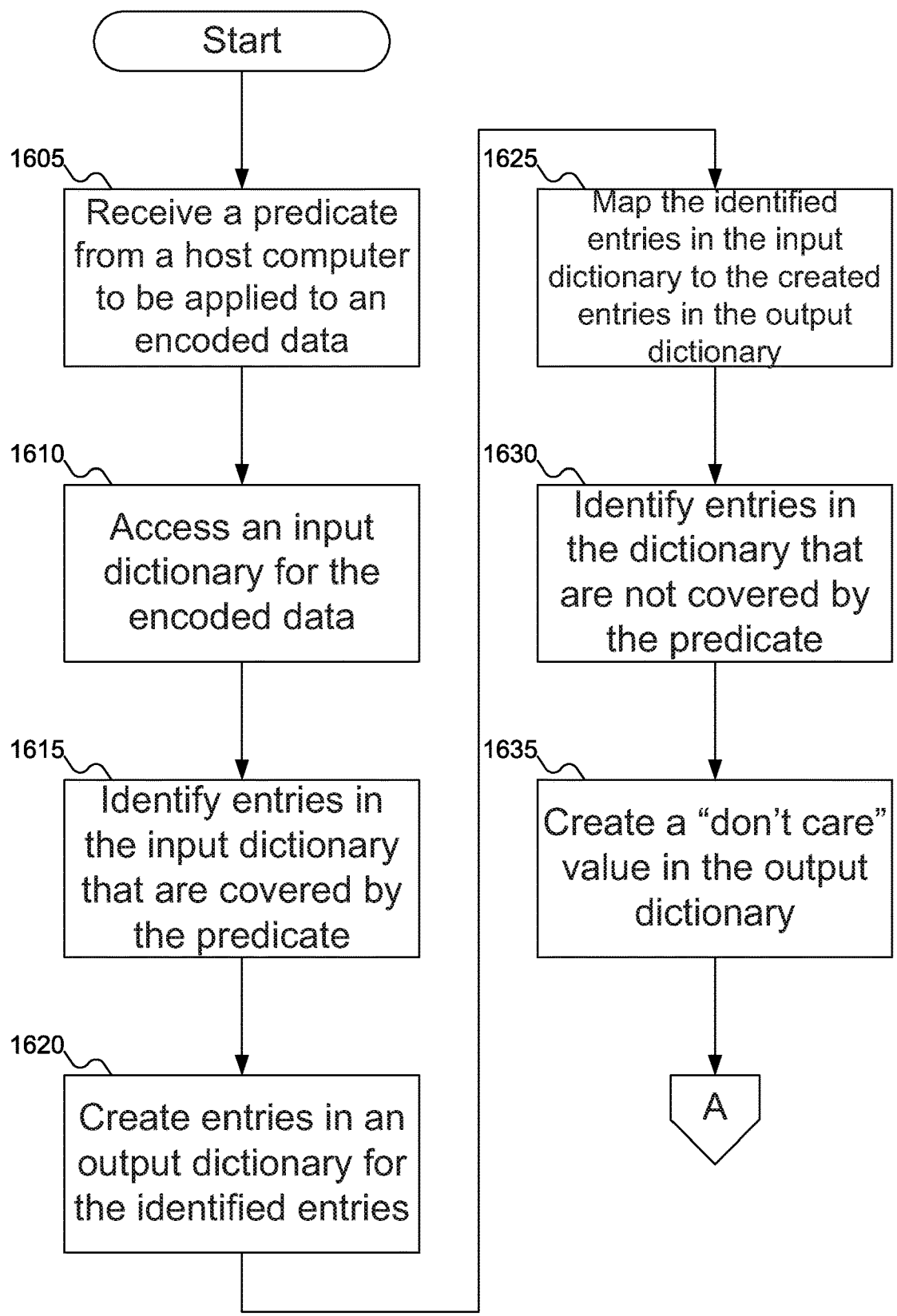
FIGS. 16A-16B show a flowchart of an example procedure for the in-storage compute controller of FIG. 10 to manage a predicate received from the host computer of FIG. 1 and potentially perform an acceleration function on transcoded data, according to an embodiment of the inventive concept.
Figure 16B:
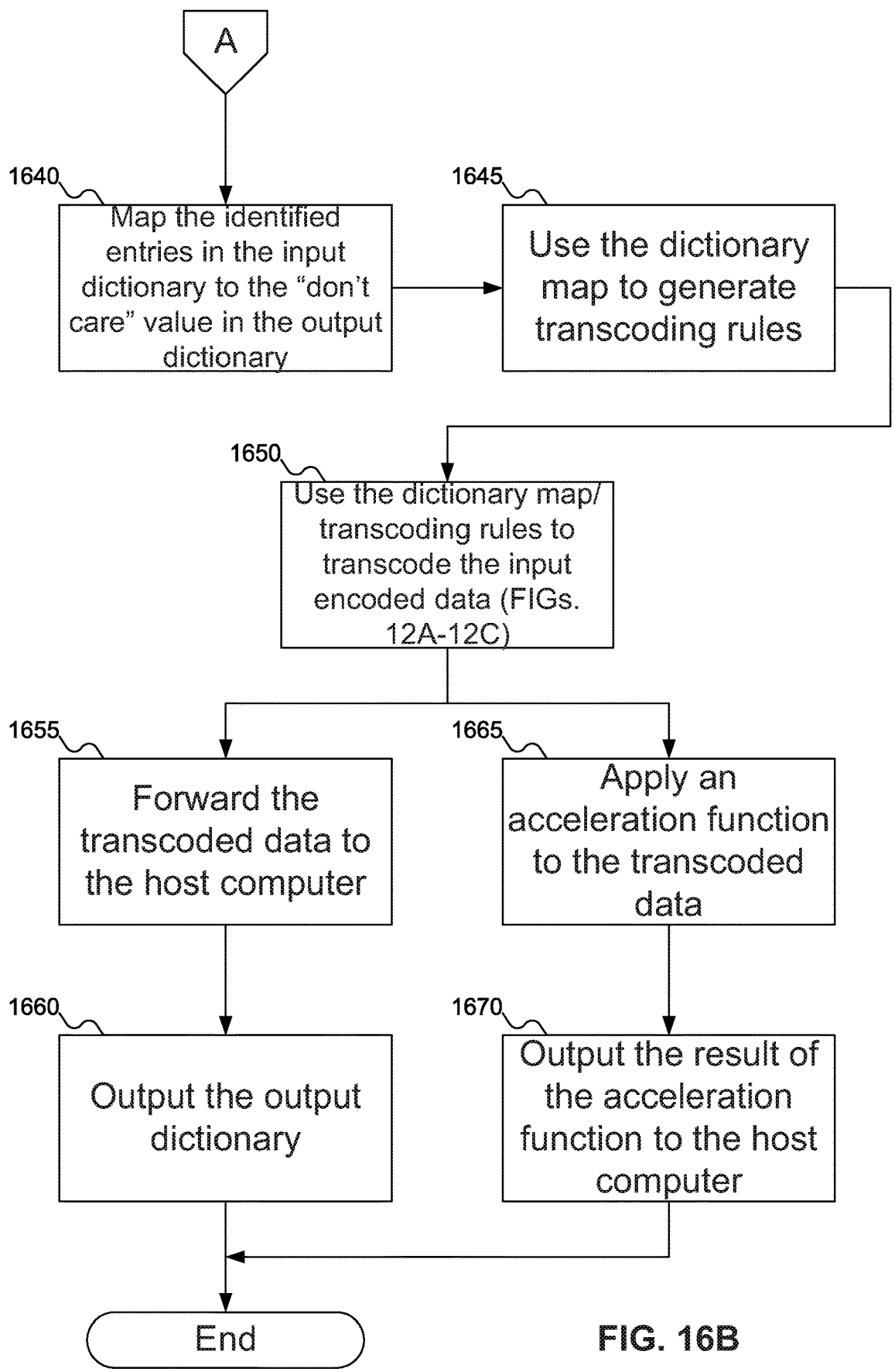

FIGS. 16A-16B show a flowchart of an example procedure for in-storage compute controller 1005 of FIG. 10 to manage a predicate received from host computer 105 of FIG. 1 and potentially perform an acceleration function on transcoded data, according to an embodiment of the inventive concept. In FIG. 16A, at block 1605, in-storage compute controller 1005 of FIG. 10 may receive a predicate from host computer 105 of FIG. 1. At block 1610, in-storage compute controller 1005 of FIG. 10 may access input dictionary 805 of FIG. 8 for encoded data covered by the query. At block 1615, in-storage compute controller 1005 of FIG. 10 may identify entries in input dictionary 805 of FIG. 8 that are covered by the predicate (that is, entries in input dictionary 805 of FIG. 8 that are of interest to host computer 105 of FIG. 1). At block 1620, in-storage compute controller 1005 of FIG. 10 may create output dictionary 810 of FIG. 8 that includes the entries that are covered by the predicate. At block 1625, in-storage compute controller 1005 of FIG. 10 may map entries in input dictionary 805 of FIG. 8 that are covered by the predicate to entries in output dictionary 810 of FIG. 8.

At block 1630, in-storage compute controller 1005 of FIG. 10 may identify entries in input dictionary 805 of FIG. 8 that are not covered by the predicate (that is, entries in input dictionary 805 of FIG. 8 that are not of interest to host computer 105 of FIG. 1). At block 1635, in-storage compute controller 1005 of FIG. 10 may add a "don't care" entry to output dictionary 810 of FIG. 8. At block 1640 (FIG. 16B), in-storage compute controller 1005 of FIG. 10 may map entries in input dictionary that are not covered by the predicate to the "don't care" entry in output dictionary 810 of FIG. 8.

At block 1645, rule evaluator 635 of FIG. 6 (within transcoder 420 of FIG. 6) may use the predicate to adapt transcoding rules 630 of FIG. 6 for the query from host computer 105 of FIG. 1. At block 1650, index mapper 615 of FIG. 6 and rule evaluator 635 of FIG. 6 (both potentially within transcoder 420 of FIG. 6) may use the map from input dictionary 805 of FIG. 8 to output dictionary 810 of FIG. 8 and transcoding rules 630 of FIG. 6 to transcode encoded data from the input stream to the output stream (as discussed above with reference to FIGS. 12A-12C).

At this point, various options exist. As shown in block 1655, in-storage compute controller 1005 of FIG. 10 may receive the output stream from transcoder 420 of FIG. 6, and may forward the transcoded data to host computer 105 of FIG. 1, and at block 1660 in-storage compute controller 1005 of FIG. 10 may send output dictionary 810 of FIG. 8 to host computer 105 of FIG. 1. Alternatively, at block 1665, in-storage compute controller 1005 of FIG. 10 may apply an acceleration function to the data in the output stream, and at block 1670 in-storage compute controller 1005 of FIG. 10 may send the result of the acceleration function to host computer 105 of FIG. 1.

In FIGS. 12A-16B, some embodiments of the inventive concept are shown. But a person skilled in the art will recognize that other embodiments of the inventive concept are also possible, by changing the order of the blocks, by omitting blocks, or by including links not shown in the drawings. All such variations of the flowcharts are considered to be embodiments of the inventive concept, whether expressly described or not.

Embodiments of the inventive concept offer technical advantages over the prior art. In conventional systems, decoded data is sent to host computer 105 of FIG. 1. Even if the data that is sent to host computer 105 of FIG. 1 is selective (that is, the data sent to host computer 105 of FIG. 1 includes data of interest), the data is still sent without compression or encoding, which means that the space savings are achieve via selectivity. In contrast, since the majority of the reduction is storage is accomplished via encoding rather than compression, sending encoded data to host computer 105 of FIG. 1 typically involves sending less data than sending decoded data to host computer 105 of FIG. 1. Further, since data may be transcoded from one encoding scheme to another, using transcoder 420 of FIG. 6 may be more efficient than decoding the data and re-encoding the data as separate operations.

The following discussion is intended to provide a brief, general description of a suitable machine or machines in which certain aspects of the inventive concept may be implemented. The machine or machines may be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines may include embedded controllers, such as programmable or non-programmable logic devices or arrays, Application Specific Integrated Circuits (ASICs), embedded computers, smart cards, and the like. The machine or machines may utilize one or more connections to one or more remote machines, such as through a network interface, modem, or other communicative coupling. Machines may be interconnected by way of a physical and/or logical network, such as an intranet, the Internet, local area networks, wide area networks, etc. One skilled in the art will appreciate that network communication may utilize various wired and/or wireless short range or long range carriers and protocols, including radio frequency (RF), satellite, microwave, Institute of Electrical and Electronics Engineers (IEEE) 802.11, Bluetooth®, optical, infrared, cable, laser, etc.

Embodiments of the present inventive concept may be described by reference to or in conjunction with associated data including functions, procedures, data structures, application programs, etc. which when accessed by a machine results in the machine performing tasks or defining abstract data types or low-level hardware contexts. Associated data may be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data may be delivered over transmission environments, including the physical and/or logical network, in the form of packets, serial data, parallel data, propagated signals, etc., and may be used in a compressed or encrypted format. Associated data may be used in a distributed environment, and stored locally and/or remotely for machine access.

Embodiments of the inventive concept may include a tangible, non-transitory machine-readable medium comprising instructions executable by one or more processors, the instructions comprising instructions to perform the elements of the inventive concepts as described herein.

The various operations of methods described above may be performed by any suitable means capable of performing the operations, such as various hardware and/or software component(s), circuits, and/or module(s). The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Having described and illustrated the principles of the inventive concept with reference to illustrated embodiments, it will be recognized that the illustrated embodiments may be modified in arrangement and detail without departing from such principles, and may be combined in any desired manner. And, although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms may reference the same or different embodiments that are combinable into other embodiments.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

Embodiments of the inventive concept may extend to the following statements, without limitation:

Statement 1. An embodiment of the inventive concept includes a transcoder, comprising:
 a buffer to store input encoded data;
 an index mapper to map from an input dictionary to an output dictionary;
 a current encode buffer to store a modified current encoded data, the modified current encoded data responsive to the input encoded data, the input dictionary, and the map from the input dictionary to the output dictionary;
 a previous encode buffer to store a modified previous encoded data, the modified previous encoded data responsive to a previous input encoded data, the input dictionary, and the map from the input dictionary to the output dictionary; and
 a rule evaluator to generate an output stream responsive to the modified current encoded data in the current encode buffer, the modified previous encoded data in the previous encode buffer, and transcoding rules.

Statement 2. An embodiment of the inventive concept includes the transcoder according to statement 1, wherein the index mapper is responsive to the transcoding rules.

Statement 3. An embodiment of the inventive concept includes the transcoder according to statement 1, wherein the transcoding rules are responsive to the index mapper.

Statement 4. An embodiment of the inventive concept includes the transcoder according to statement 1, wherein the index mapper is responsive to a selected subset of entries in the input dictionary.

Statement 5. An embodiment of the inventive concept includes the transcoder according to statement 1, wherein the rule evaluator includes at least one of a processor, a Field Programmable Gate Array (FPGA), an Application-Specific Integrated Circuit (ASIC), a Graphics Processing Unit (GPU), or a General Purpose GPU (GPGPU).

Statement 6. An embodiment of the inventive concept includes the transcoder according to statement 5, wherein the rule evaluator further includes at least one of software to implement the transcoding rules and storage for a table listing the transcoding rules.

Statement 7. An embodiment of the inventive concept includes the transcoder according to statement 5, wherein the rule evaluator further includes circuitry to implement the transcoding rules.

Statement 8. An embodiment of the inventive concept includes the transcoder according to statement 1, wherein the rule evaluator is operative generate the modified current encoded data from the input encoded data using the transcoding rules.

Statement 9. An embodiment of the inventive concept includes the transcoder according to statement 8, wherein the rule evaluator is operative to add the modified previous encoded data to the output stream.

Statement 10. An embodiment of the inventive concept includes the transcoder according to statement 9, wherein the rule evaluator is further operative to move the modified current encoded data from the current encode buffer to the modified previous encoded data in the previous encode buffer.

Statement 11. An embodiment of the inventive concept includes the transcoder according to statement 8, wherein the rule evaluator is operative to modify the modified previous encoded data to include the modified current encoded data using the transcoding rules.

Statement 12. An embodiment of the inventive concept includes the transcoder according to statement 11, wherein the rule evaluator is further operative to change the first encoding scheme of the input encoded data to the second encoding scheme when generating the modified current encoded data.

Statement 13. An embodiment of the inventive concept includes the transcoder according to statement 11, wherein the rule evaluator is further operative to change a first encoding scheme of the input encoded data to a second encoding scheme when generating the modified current encoded data.

Statement 14. An embodiment of the inventive concept includes the transcoder according to statement 8, wherein the rule evaluator is operative to determine a first encoding scheme of the input encoded data from the input encoded data, the first encoding scheme one of at least two encoding schemes used by the input encoded data.

Statement 15. An embodiment of the inventive concept includes the transcoder according to statement 1, further comprising a stream splitter to identify a first chunk in the input encoded data using a first encoding scheme and a second chunk in the input encoded data using a second encoding scheme.

Statement 16. An embodiment of the inventive concept includes the transcoder according to statement 1, wherein the index mapper is operative to map at least one entry in the input dictionary to a "don't care" value in the output dictionary.

Statement 17. An embodiment of the inventive concept includes the transcoder according to statement 1, wherein the index mapper is operative to add a "don't care" value to the output dictionary.

Statement 18. An embodiment of the inventive concept includes the transcoder according to statement 1, wherein:

the input encoded data is a compressed input encoded data; and the transcoder further comprises a decompression engine.

Statement 19. An embodiment of the inventive concept includes the transcoder according to statement 1, wherein the transcoder operates to produce the output stream from the input encoded data without decoding the input encoded data.

Statement 20. An embodiment of the inventive concept includes the transcoder according to statement 1, wherein the transcoder is included in a Solid State Drive (SSD) storage device.

Statement 21. An embodiment of the inventive concept includes the transcoder according to statement 20, wherein the input encoded data is received from a storage within the SSD storage device.

Statement 22. An embodiment of the inventive concept includes a method, comprising: receiving a first chunk of data from an input encoded data at a transcoder from a storage device;
 determining that the first chunk of data is of interest to a host computer;
 generating a first encoded data from the first chunk of data based at least in part on the first chunk of data being of interest to the host computer;
 receiving a second chunk of data from the input encoded data at the transcoder from the storage device;
 determining that the second chunk of data is not of interest to the host computer;
 generating a second encoded data from the second chunk of data based at least in part on the second chunk of data not being of interest to the host computer; and
 outputting the first encoded data and the second encoded data to the host computer.

Statement 23. An embodiment of the inventive concept includes the method according to statement 22, wherein generating a second encoded data from the second chunk of data based at least in part on the second chunk of data not being of interest to the host computer includes changing a value in the first encoded data to a "don't care" value.

Statement 24. An embodiment of the inventive concept includes the method according to statement 23, wherein generating a second encoded data from the second chunk of data based at least in part on the second chunk of data not being of interest to the host computer further includes combining the second encoded data with a third encoded data including the "don't care" value.

Statement 25. An embodiment of the inventive concept includes the method according to statement 24, wherein generating a second encoded data from the second chunk of data based at least in part on the second chunk of data not being of interest to the host computer further includes changing a first encoding scheme of at least one of the second chunk of data and the third encoded data to a second encoding scheme.

Statement 26. An embodiment of the inventive concept includes the method according to statement 25, wherein changing a first encoding scheme of at least one of the second chunk of data and the third encoded data to a second encoding scheme includes changing the first encoding scheme of the second chunk of data to the second encoding scheme in the second encoded data.

Statement 27. An embodiment of the inventive concept includes the method according to statement 25, wherein changing a first encoding scheme of at least one of the second chunk of data and the third encoded data to a second encoding scheme includes changing the first encoding scheme of the third encoded data to the second encoding scheme.

Statement 28. An embodiment of the inventive concept includes the method according to statement 22, wherein generating a first encoded data from the first chunk of data based at least in part on the first chunk of data being of interest to the host computer includes combining the first encoded data with a third encoded data.

Statement 29. An embodiment of the inventive concept includes the method according to statement 28, wherein generating a first encoded data from the first chunk of data based at least in part on the first chunk of data being of interest to the host computer further includes changing a first encoding scheme of at least one of the first chunk of data and the third encoded data to a second encoding scheme.

Statement 30. An embodiment of the inventive concept includes the method according to statement 29, wherein changing a first encoding scheme of at least one of the first chunk of data and the third encoded data to a second encoding scheme includes changing the first encoding scheme of the first chunk of data to the second encoding scheme in the first encoded data.

Statement 31. An embodiment of the inventive concept includes the method according to statement 29, wherein changing a first encoding scheme of at least one of the first chunk of data and the third encoded data to a second encoding scheme includes changing the first encoding scheme of the third encoded data to the second encoding scheme.

Statement 32. An embodiment of the inventive concept includes the method according to statement 22, wherein generating a first encoded data from the first chunk of data based at least in part on the first chunk of data being of interest to the host computer includes generating the first encoded data from the first chunk of data based at least in part on transcoding rules; and generating a second encoded data from the second chunk of data based at least in part on the second chunk of data not being of interest to the host computer includes generating the second encoded data from the second chunk of data based at least in part on the transcoding rules.

Statement 33. An embodiment of the inventive concept includes the method according to statement 22, wherein receiving a first chunk of data from an input encoded data at a transcoder from a storage device includes:
 receiving the input encoded data at a stream splitter;
 identifying the first chunk of data and the second chunk of data by the stream splitter in the input encoded data, the first chunk of data encoded using a first encoding scheme and the second chunk of data encoded using a second encoding scheme; and receiving the first chunk of data from the input encoded data from the stream splitter.

Statement 34. An embodiment of the inventive concept includes the method according to statement 22, further comprising:
 receiving an input dictionary from the storage device;
 mapping the input dictionary to an output dictionary based at least in part on data of interest to the host computer and data that is not of interest to the host computer; and
 outputting the output dictionary to the host computer.

Statement 35. An embodiment of the inventive concept includes the method according to statement 34, wherein mapping the input dictionary to an output dictionary based at least in part on data of interest to the host computer and data that is not of interest to the host computer includes mapping the input dictionary to an output dictionary based at least in part on transcoding rules.

Statement 36. An embodiment of the inventive concept includes the method according to statement 34, wherein mapping the input dictionary to an output dictionary based at least in part on data of interest to the host computer and data that is not of interest to the host computer includes mapping the input dictionary to an output dictionary based at least in part on a selected subset of entries in the input dictionary.

Statement 37. An embodiment of the inventive concept includes the method according to statement 22, wherein the transcoder operates to produce the first encoded data and the second encoded data from the input encoded data without decoding the input encoded data.

Statement 38. An embodiment of the inventive concept includes the method according to statement 22, wherein the transcoder is included in a Solid State Drive (SSD) storage device.

Statement 39. An embodiment of the inventive concept includes the method according to statement 38, wherein:
  receiving a first chunk of data from an input encoded data at a transcoder from a storage device includes receiving the first chunk of data from the input encoded data at the transcoder from a storage within the SSD storage device; and
  receiving a second chunk of data from the input encoded data at the transcoder from the storage device includes receiving the second chunk of data from the input encoded data at the transcoder from the storage within the SSD storage device.

Statement 40. An embodiment of the inventive concept includes an article, comprising a non-transitory storage medium, the non-transitory storage medium having stored thereon instructions that, when executed by a machine, result in:
  receiving a first chunk of data from an input encoded data at a transcoder from a storage device;
  determining that the first chunk of data is of interest to a host computer;
  generating a first encoded data from the first chunk of data based at least in part on the first chunk of data being of interest to the host computer;
  receiving a second chunk of data from the input encoded data at the transcoder from the storage device;
  determining that the second chunk of data is not of interest to the host computer;
  generating a second encoded data from the second chunk of data based at least in part on the second chunk of data not being of interest to the host computer; and
  outputting the first encoded data and the second encoded data to the host computer.

Statement 41. An embodiment of the inventive concept includes the article according to statement 40, wherein generating a second encoded data from the second chunk of data based at least in part on the second chunk of data not being of interest to the host computer includes changing a value in the first encoded data to a "don't care" value.

Statement 42. An embodiment of the inventive concept includes the article according to statement 41, wherein generating a second encoded data from the second chunk of data based at least in part on the second chunk of data not being of interest to the host computer further includes combining the second encoded data with a third encoded data including the "don't care" value.

Statement 43. An embodiment of the inventive concept includes the article according to statement 42, wherein generating a second encoded data from the second chunk of data based at least in part on the second chunk of data not being of interest to the host computer further includes changing a first encoding scheme of at least one of the second chunk of data and the third encoded data to a second encoding scheme.

Statement 44. An embodiment of the inventive concept includes the article according to statement 43, wherein changing a first encoding scheme of at least one of the second chunk of data and the third encoded data to a second encoding scheme includes changing the first encoding scheme of the second chunk of data to the second encoding scheme in the second encoded data.

Statement 45. An embodiment of the inventive concept includes the article according to statement 43, wherein changing a first encoding scheme of at least one of the second chunk of data and the third encoded data to a second encoding scheme includes changing the first encoding scheme of the third encoded data to the second encoding scheme.

Statement 46. An embodiment of the inventive concept includes the article according to statement 40, wherein generating a first encoded data from the first chunk of data based at least in part on the first chunk of data being of interest to the host computer includes combining the first encoded data with a third encoded data.

Statement 47. An embodiment of the inventive concept includes the article according to statement 46, wherein generating a first encoded data from the first chunk of data based at least in part on the first chunk of data being of interest to the host computer further includes changing a first encoding scheme of at least one of the first chunk of data and the third encoded data to a second encoding scheme.

Statement 48. An embodiment of the inventive concept includes the article according to statement 47, wherein changing a first encoding scheme of at least one of the first chunk of data and the third encoded data to a second encoding scheme includes changing the first encoding scheme of the first chunk of data to the second encoding scheme in the first encoded data.

Statement 49. An embodiment of the inventive concept includes the article according to statement 47, wherein changing a first encoding scheme of at least one of the first chunk of data and the third encoded data to a second encoding scheme includes changing the first encoding scheme of the third encoded data to the second encoding scheme.

Statement 50. An embodiment of the inventive concept includes the article according to statement 40, wherein generating a first encoded data from the first chunk of data based at least in part on the first chunk of data being of interest to the host computer includes generating the first encoded data from the first chunk of data based at least in part on transcoding rules; and generating a second encoded data from the second chunk of data based at least in part on the second chunk of data not being of interest to the host computer includes generating the second encoded data from the second chunk of data based at least in part on the transcoding rules.

Statement 51. An embodiment of the inventive concept includes the article according to statement 40, wherein receiving a first chunk of data from an input encoded data at a transcoder from a storage device includes:
  receiving the input encoded data at a stream splitter;
  identifying the first chunk of data and the second chunk of data by the stream splitter in the input encoded data, the first chunk of data encoded using a first encoding scheme and the second chunk of data encoded using a second encoding scheme; and
  receiving the first chunk of data from the input encoded data from the stream splitter.

Statement 52. An embodiment of the inventive concept includes the article according to statement 40, the non-transitory storage medium having stored thereon further instructions that, when executed by the machine, result in:
  receiving an input dictionary from the storage device;
  mapping the input dictionary to an output dictionary based at least in part on data of interest to the host computer and data that is not of interest to the host computer; and
  outputting the output dictionary to the host computer.

Statement 53. An embodiment of the inventive concept includes the article according to statement 52, wherein mapping the input dictionary to an output dictionary based at least in part on data of interest to the host computer and data that is not of interest to the host computer includes mapping the input dictionary to an output dictionary based at least in part on transcoding rules.

Statement 54. An embodiment of the inventive concept includes the article according to statement 52, wherein mapping the input dictionary to an output dictionary based at least in part on data of interest to the host computer and data that is not of interest to the host computer includes mapping the input dictionary to an output dictionary based at least in part on a selected subset of entries in the input dictionary.

Statement 55. An embodiment of the inventive concept includes the article according to statement 40, wherein the transcoder operates to produce the first encoded data and the second encoded data from the input encoded data without decoding the input encoded data.

Statement 56. An embodiment of the inventive concept includes the article according to statement 40, wherein the transcoder is included in a Solid State Drive (SSD) storage device.

Statement 57. An embodiment of the inventive concept includes the article according to statement 56, wherein:
  receiving a first chunk of data from an input encoded data at a transcoder from a storage device includes receiving the first chunk of data from the input encoded data at the transcoder from a storage within the SSD storage device; and
  receiving a second chunk of data from the input encoded data at the transcoder from the storage device includes receiving the second chunk of data from the input encoded data at the transcoder from the storage within the SSD storage device.

Statement 58. An embodiment of the inventive concept includes a storage device, comprising:
  storage for an input encoded data;
  a controller to process read requests and write requests from a host computer on the storage;
  an in-storage compute (ISC) controller to receive a predicate originating from the host computer, the predicate to be applied to the input encoded data stored in the storage; and
  a transcoder including an index mapper to map from an input dictionary for the input encoded data to an output dictionary, the input dictionary including at least one first entry and at least one second entry, the at least one first entry mapped to at least one third entry in the output dictionary and the at least one second entry mapped to a "don't care" entry in the output dictionary.

Statement 59. An embodiment of the inventive concept includes the storage device according to statement 58, wherein the transcoder includes at least one of a processor, a Field Programmable Gate Array (FPGA), an Application-Specific Integrated Circuit (ASIC), a Graphics Processing Unit (GPU), or a General Purpose GPU (GPGPU).

Statement 60. An embodiment of the inventive concept includes the storage device according to statement 58, wherein the ISC controller is operative to apply an acceleration function on an output encoded data from the transcoder.

Statement 61. An embodiment of the inventive concept includes the storage device according to statement 60, wherein the ISC controller is further operative to output a result of the acceleration function on the output encoded data from the transcoder to the host computer.

Statement 62. An embodiment of the inventive concept includes the storage device according to statement 58, wherein the ISC controller is operative to forward an output encoded data of the transcoder to the host computer.

Statement 63. An embodiment of the inventive concept includes the storage device according to statement 62, wherein the ISC controller is further operative to forward the output dictionary to the host computer.

Statement 64. An embodiment of the inventive concept includes the storage device according to statement 58, wherein the transcoder is operative to generate an output encoded data based at least in part on the input encoded data and the map from the input dictionary to the output dictionary.

Statement 65. An embodiment of the inventive concept includes the storage device according to statement 64, wherein the transcoder includes:
  a buffer to store the input encoded data;
  the index mapper;
  a current encode buffer to store a modified current encoded data, the modified current encoded data responsive to the input encoded data and the map from the input dictionary to the output dictionary;
  a previous encode buffer to store a modified previous encoded data, the modified previous encoded data responsive to a previous input encoded data and the map from the input dictionary to the output dictionary; and
  a rule evaluator to generate an output stream responsive to the modified current encoded data in the current encode buffer, the modified previous encoded data in the previous encode buffer, and transcoding rules.

Statement 66. An embodiment of the inventive concept includes the storage device according to statement 65, wherein the transcoding rules are based at least in part on the predicate.

Statement 67. An embodiment of the inventive concept includes the storage device according to statement 65, wherein the rule evaluator to generate the output stream responsive to the modified current encoded data in the current encode buffer, the modified previous encoded data in the previous encode buffer, and the transcoding rules without decoding the input encoded data.

Statement 68. An embodiment of the inventive concept includes the storage device according to statement 64, wherein:
 the input encoded data uses a first encoding scheme;
 the output encoded data uses a second encoding scheme; and
 the second encoding scheme is different from the first encoding scheme.

Statement 69. An embodiment of the inventive concept includes the storage device according to statement 58, wherein the input encoded data is stored in the storage in a columnar format.

Statement 70. An embodiment of the inventive concept includes the storage device according to statement 69, wherein the input encoded data includes an input file stored using an Apache Parquet storage format.

Statement 71. An embodiment of the inventive concept includes the storage device according to statement 69, further comprising a column chunk processor to process a column chunk including the input encoded data and forward the input encoded data to the transcoder.

Statement 72. An embodiment of the inventive concept includes the storage device according to statement 71, wherein the column chunk processor includes the transcoder.

Statement 73. An embodiment of the inventive concept includes the storage device according to statement 71, wherein the column chunk processor includes at least one of a processor, a Field Programmable Gate Array (FPGA), an Application-Specific Integrated Circuit (ASIC), a Graphics Processing Unit (GPU), or a General Purpose GPU (GPGPU).

Statement 74. An embodiment of the inventive concept includes the storage device according to statement 58, wherein the transcoder is operative to generate transcoding rules to apply to the input encoded data based at least in part on the predicate to produce an output encoded data.

Statement 75. An embodiment of the inventive concept includes the storage device according to statement 74, wherein the transcoder is operative to produce the output encoded data without decoding the input encoded data.

Statement 76. An embodiment of the inventive concept includes a method, comprising:
 receiving a predicate to apply to an input encoded data at a transcoder; accessing an input dictionary for the input encoded data;
 identifying at least one first entry in the input dictionary that is covered by the predicate and at least one second entry in the input dictionary that is not covered by the predicate;
 generating a output dictionary that excludes the at least one second entry in the dictionary that is not covered by the predicate, the transcoding dictionary including at least a third entry and a "don't care" entry; and
 generating a dictionary map by the transcoder that maps the at least one first entry in the input dictionary to the at least one third entry in the output dictionary and that maps the at least one second entry in the input dictionary that is not covered by the predicate to the "don't care" entry in the output dictionary.

Statement 77. An embodiment of the inventive concept includes the method according to statement 76, wherein the input encoded data is stored in a columnar format.

Statement 78. An embodiment of the inventive concept includes the method according to statement 77, wherein the input encoded data includes an input file stored using an Apache Parquet storage format.

Statement 79. An embodiment of the inventive concept includes the method according to statement 76, wherein the input encoded data includes a column chunk stored in a columnar format.

Statement 80. An embodiment of the inventive concept includes the method according to statement 76, further comprising:
 using the dictionary map to transcode the input encoded data into an output encoded data; and
 outputting the output encoded data.

Statement 81. An embodiment of the inventive concept includes the method according to statement 80, wherein using the dictionary map to transcode the input encoded data into an output encoded data includes:
 receiving a first chunk of data from the input encoded data at the transcoder;
 determining that the first chunk of data is covered by the predicate;
 generating a first encoded data from the first chunk of data based at least in part on the first chunk of data being of interest to the host computer using the dictionary map;
 receiving a second chunk of data from the input encoded data at the transcoder from the storage device;
 determining that the second chunk of data is not covered by the predicate;
 generating a second encoded data from the second chunk of data based at least in part on the second chunk of data not being of interest to the host computer using the dictionary map; and
 outputting the first encoded data and the second encoded data.

Statement 82. An embodiment of the inventive concept includes the method according to statement 81, wherein receiving a first chunk of data from the input encoded data at the transcoder includes:
 receiving, at a column chunk processor, a list of block identifiers (IDs) from an in-storage compute (ISC) controller;
 accessing, by the column chunk processor, a column chunk including a block ID in the list of block IDs;
 retrieving the input encoded data from the column chunk by the column chunk processor; and
 forwarding the input encoded data from the column chunk processor to the transcoder.

Statement 83. An embodiment of the inventive concept includes the method according to statement 81, further comprising generating transcoding rules to apply to the input encoded data based at least in part on the predicate.

Statement 84. An embodiment of the inventive concept includes the method according to statement 80, wherein using the dictionary map to transcode the input encoded data into an output encoded data includes using the dictionary map to transcode the input encoded data into an output encoded data without decoding the input encoded data.

Statement 85. An embodiment of the inventive concept includes the method according to statement 80, wherein:
 the input encoded data uses a first encoding scheme;
 the output encoded data uses a second encoding scheme; and
 the second encoding scheme is different from the first encoding scheme.

Statement 86. An embodiment of the inventive concept includes the method according to statement 80, wherein outputting the output encoded data includes outputting the output encoded data to an ISC controller.

Statement 87. An embodiment of the inventive concept includes the method according to statement 86, wherein outputting the output encoded data to an ISC controller further includes outputting the output dictionary to the ISC controller.

Statement 88. An embodiment of the inventive concept includes the method according to statement 87, further comprising forwarding the output encoded data and the output dictionary from the ISC controller to a host computer.

Statement 89. An embodiment of the inventive concept includes the method according to statement 87, further comprising performing an acceleration function on the output encoded data by the ISC controller to produce an accelerated data.

Statement 90. An embodiment of the inventive concept includes the method according to statement 89, further comprising outputting the accelerated data from the ISC controller to a host computer.

Statement 91. An embodiment of the inventive concept includes the method according to statement 76, further comprising outputting the output dictionary.

Statement 92. An embodiment of the inventive concept includes the method according to statement 76, wherein receiving a predicate to apply to an input encoded data includes receiving the predicate to apply to the input encoded data from an ISC controller.

Statement 93. An embodiment of the inventive concept includes the method according to statement 92, further comprising receiving the input dictionary from the ISC controller.

Statement 94. An embodiment of the inventive concept includes the method according to statement 76, further comprising:
  determining that there is no entry in the input dictionary that is not covered by the predicate; and
  outputting the input encoded data without transcoding the input encoded data to an output encoded data.

Statement 95. An embodiment of the inventive concept includes an article, comprising a non-transitory storage medium, the non-transitory storage medium having stored thereon instructions that, when executed by a machine, result in:
  receiving a predicate to apply to an input encoded data at a transcoder; accessing an input dictionary for the input encoded data;
  identifying at least one first entry in the input dictionary that is covered by the predicate and at least one second entry in the input dictionary that is not covered by the predicate;
  generating a output dictionary that excludes the at least one second entry in the dictionary that is not covered by the predicate, the transcoding dictionary including at least a third entry and a "don't care" entry; and
  generating a dictionary map by the transcoder that maps the at least one first entry in the input dictionary to the at least one third entry in the output dictionary and that maps the at least one second entry in the input dictionary that is not covered by the predicate to the "don't care" entry in the output dictionary.

Statement 96. An embodiment of the inventive concept includes the article according to statement 95, wherein the input encoded data is stored in a columnar format.

Statement 97. An embodiment of the inventive concept includes the article according to statement 96, wherein the input encoded data includes an input file stored using an Apache Parquet storage format.

Statement 98. An embodiment of the inventive concept includes the article according to statement 95, wherein the input encoded data includes a column chunk stored in a columnar format.

Statement 99. An embodiment of the inventive concept includes the article according to statement 95, the non-transitory storage medium having stored thereon further instructions that, when executed by the machine, result in:
  using the dictionary map to transcode the input encoded data into an output encoded data; and
  outputting the output encoded data.

Statement 100. An embodiment of the inventive concept includes the article according to statement 99, wherein using the dictionary map to transcode the input encoded data into an output encoded data includes:
  receiving a first chunk of data from the input encoded data at the transcoder;
  determining that the first chunk of data is covered by the predicate;
  generating a first encoded data from the first chunk of data based at least in part on the first chunk of data being of interest to the host computer using the dictionary map;
  receiving a second chunk of data from the input encoded data at the transcoder from the storage device;
  determining that the second chunk of data is not covered by the predicate;
  generating a second encoded data from the second chunk of data based at least in part on the second chunk of data not being of interest to the host computer using the dictionary map; and
  outputting the first encoded data and the second encoded data.

Statement 101. An embodiment of the inventive concept includes the article according to statement 100, wherein receiving a first chunk of data from the input encoded data at the transcoder includes:
  receiving, at a column chunk processor, a list of block identifiers (IDs) from an in-storage compute (ISC) controller;
  accessing, by the column chunk processor, a column chunk including a block ID in the list of block IDs;
  retrieving the input encoded data from the column chunk by the column chunk processor; and
  forwarding the input encoded data from the column chunk processor to the transcoder.

Statement 102. An embodiment of the inventive concept includes the article according to statement 100, the non-transitory storage medium having stored thereon further instructions that, when executed by the machine, result in generating transcoding rules to apply to the input encoded data based at least in part on the predicate.

Statement 103. An embodiment of the inventive concept includes the article according to statement 99, wherein using the dictionary map to transcode the input encoded data into an output encoded data includes using the dictionary map to transcode the input encoded data into an output encoded data without decoding the input encoded data.

Statement 104. An embodiment of the inventive concept includes the article according to statement 99, wherein:
  the input encoded data uses a first encoding scheme;
  the output encoded data uses a second encoding scheme; and
  the second encoding scheme is different from the first encoding scheme.

Statement 105. An embodiment of the inventive concept includes the article according to statement 99, wherein outputting the output encoded data includes outputting the output encoded data to an ISC controller.

Statement 106. An embodiment of the inventive concept includes the article according to statement 105, wherein outputting the output encoded data to an ISC controller further includes outputting the output dictionary to the ISC controller.

Statement 107. An embodiment of the inventive concept includes the article according to statement 106, the non-transitory storage medium having stored thereon further instructions that, when executed by the machine, result in forwarding the output encoded data and the output dictionary from the ISC controller to a host computer.

Statement 108. An embodiment of the inventive concept includes the article according to statement 106, the non-transitory storage medium having stored thereon further instructions that, when executed by the machine, result in performing an acceleration function on the output encoded data by the ISC controller to produce an accelerated data.

Statement 109. An embodiment of the inventive concept includes the article according to statement 108, the non-transitory storage medium having stored thereon further instructions that, when executed by the machine, result in outputting the accelerated data from the ISC controller to a host computer.

Statement 110. An embodiment of the inventive concept includes the article according to statement 95, the non-transitory storage medium having stored thereon further instructions that, when executed by the machine, result in outputting the output dictionary.

Statement 111. An embodiment of the inventive concept includes the article according to statement 95, wherein receiving a predicate to apply to an input encoded data includes receiving the predicate to apply to the input encoded data from an ISC controller.

Statement 112. An embodiment of the inventive concept includes the article according to statement 111, the non-transitory storage medium having stored thereon further instructions that, when executed by the machine, result in receiving the input dictionary from the ISC controller.

Statement 113. An embodiment of the inventive concept includes the article according to statement 95, the non-transitory storage medium having stored thereon further instructions that, when executed by the machine, result in:
determining that there is no entry in the input dictionary that is not covered by the predicate; and
outputting the input encoded data without transcoding the input encoded data to an output encoded data.

Consequently, in view of the wide variety of permutations to the embodiments described herein, this detailed description and accompanying material is intended to be illustrative only, and should not be taken as limiting the scope of the inventive concept. What is claimed as the inventive concept, therefore, is all such modifications as may come within the scope and spirit of the following claims and equivalents thereto.

What is claimed is:

1. A storage device, comprising:
   storage for a data;
   a controller to process read requests and write requests received from a host computer on the storage device;
   a processor to receive a filter originating from the host computer, the filter to be applied to the data; and
   a mapper to map from an input table to an output table for the data based at least in part on the filter, the input table including a first entry, the output table including a second entry mapped to from the first entry.

2. The storage device according to claim 1, wherein the transcoder includes at least one of a processor, a Field Programmable Gate Array (FPGA), an Application-Specific Integrated Circuit (ASIC), a Graphics Processing Unit (GPU), or a General Purpose GPU (GPGPU).

3. The storage device according to claim 1, wherein the processor is operative to apply an acceleration function on a second data encoded using the output table.

4. The storage device according to claim 3, wherein the storage device is configured to generate the second data based at least in part on the data and the map from the input table to the output table.

5. The storage device according to claim 4, wherein:
   the data uses a first encoding scheme;
   the second data uses a second encoding scheme; and
   the second encoding scheme is different from the first encoding scheme.

6. The storage device according to claim 4, further comprising:
   a first buffer to store the data;
   a second buffer to store a first encoded data, the first encoded data responsive to the data and the map from the input table to the output table;
   a third buffer to store a second encoded data, the second encoded data responsive to a second data and the map from the input table to the output table; and
   a rule evaluator to generate an output stream responsive to the first encoded data in the second buffer, the second encoded data in the third buffer, and at least one transcoding rule.

7. The storage device according to claim 6, wherein the at least one transcoding rule is based at least in part on the filter.

8. The storage device according to claim 1, wherein the data is stored in the storage in a columnar format.

9. The storage device according to claim 8, further comprising a column chunk processor to process a column chunk including the data.

10. The storage device according to claim 9, wherein the column chunk processor includes at least one of a processor, an FPGA, an ASIC, a GPU, or a GPGPU.

11. A method, comprising:
    receiving a filter to apply to a data;
    accessing an input table for the data;
    identifying a first entry in the input table covered by the filter and a second entry in the input table not covered by the filter;
    generating an output table including a third entry and a fourth entry; and
    generating a map from the first entry in the input table to the third entry in the output table and from the second entry in the input table to the fourth entry in the output table.

12. The method according to claim 11, wherein the data includes a column chunk stored in a columnar format.

13. The method according to claim 11, further comprising:
    using the map to transcode the data into a second data; and
    outputting the second data.

14. The method according to claim 13, wherein using the map to transcode the data into the second data includes:
    receiving a first chunk from the data;
    determining that the first chunk is covered by the filter;
    generating a second chunk from the first chunk of data using the map; and
    outputting the second chunk.

15. The method according to claim 14, further comprising generating transcoding rules to apply to the data based at least in part on the filter.

16. The method according to claim 13, wherein outputting the second data includes outputting the second data to a controller of a storage device.

17. The method according to claim 16, wherein outputting the second data to the controller further includes outputting the output table to the controller.

18. The method according to claim 17, further comprising performing an acceleration function on the second data by the controller to produce a third data.

19. An article, comprising a non-transitory storage medium, the non-transitory storage medium having stored thereon instructions that, when executed by a machine, result in:
- receiving a filter to apply to a data;
- accessing an input table for the data;
- identifying a first entry in the input table covered by the filter and a second entry in the input table not covered by the filter;
- generating an output table including a third entry and a fourth entry; and
- generating a map from the first entry in the input table to the third entry in the output table and from the second entry in the input table to the fourth entry in the output table.

20. The article according to claim 19, wherein the data includes a column chunk stored in a columnar format.

* * * * *